United States Patent
Kawasaki et al.

(10) Patent No.: US 7,999,194 B2
(45) Date of Patent: Aug. 16, 2011

(54) MULTI-LAYER PRINTED CIRCUIT BOARD AND METHOD OF MANUFACTURING MULTI-LAYER PRINTED CIRCUIT BOARD

(75) Inventors: Yogo Kawasaki, Ogaki (JP); Hiroaki Satake, Ogaki (JP); Yutaka Iwata, Ogaki (JP); Tetsuya Tanabe, Ogaki (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 0 days.

(21) Appl. No.: 12/179,201

(22) Filed: Jul. 24, 2008

(65) Prior Publication Data
US 2008/0283282 A1 Nov. 20, 2008

Related U.S. Application Data

(60) Continuation of application No. 11/333,228, filed on Jan. 18, 2006, now Pat. No. 7,795,542, which is a division of application No. 11/106,642, filed on Apr. 15, 2005, now Pat. No. 7,178,234, which is a division of application No. 09/830,963, filed as application No. PCT/JP00/07037 on Oct. 10, 2000, now Pat. No. 6,930,258.

(30) Foreign Application Priority Data

Oct. 26, 1999 (JP) .................................. 11-303305
Oct. 26, 1999 (JP) .................................. 11-303306
Oct. 26, 1999 (JP) .................................. 11-303307
Feb. 8, 2000 (JP) .............................. 2000-029988

(51) Int. Cl.
*H05K 1/11* (2006.01)
(52) U.S. Cl. ...................................... 174/264; 174/262

(58) Field of Classification Search ............. 174/26–266
See application file for complete search history.

(56) References Cited

U.S. PATENT DOCUMENTS

| 4,496,475 A | * | 1/1985 | Abrams ........................ 252/514 |
| 4,816,323 A | | 3/1989 | Inoue |
| 5,004,639 A | | 4/1991 | Desai |
| 5,153,986 A | | 10/1992 | Brauer et al. |

(Continued)

FOREIGN PATENT DOCUMENTS

CN 1140008 A 1/1997

(Continued)

OTHER PUBLICATIONS

Patent Abstracts of Japan, 09-246732, Sep. 19, 1997, Kawade Masahito, Multilayer Printed Wiring Board and Manufacturing Method Thereof.

(Continued)

*Primary Examiner* — Ishwarbhai B Patel
(74) *Attorney, Agent, or Firm* — Oblon, Spivak, McClelland, Maier & Neustadt, L.L.P.

(57) ABSTRACT

Through holes 36 are formed to penetrate a core substrate 30 and lower interlayer resin insulating layers 50, and via holes 66 are formed right on the through holes 36, respectively. Due to this, the through holes 36 and the via holes 66 are arranged linearly, thereby making it possible to shorten wiring length and to accelerate signal transmission speed. Also, since the through holes 36 and the via holes 66 to be connected to solder bumps 76 (conductive connection pins 78), respectively, are directly connected to one another, excellent reliability in connection is ensured.

12 Claims, 22 Drawing Sheets

U.S. PATENT DOCUMENTS

| | | | |
|---|---|---|---|
| 5,450,290 A * | 9/1995 | Boyko et al. | 361/792 |
| 5,487,218 A | 1/1996 | Bhatt et al. | |
| 5,557,844 A | 9/1996 | Bhatt et al. | |
| 5,590,460 A | 1/1997 | DiStefano et al. | |
| 5,758,413 A | 6/1998 | Chong et al. | |
| 5,827,604 A | 10/1998 | Uno et al. | |
| 5,837,155 A * | 11/1998 | Inagaki et al. | 216/18 |
| 5,879,568 A | 3/1999 | Urasaki et al. | |
| 5,891,606 A | 4/1999 | Brown | |
| 5,906,042 A | 5/1999 | Lan et al. | |
| 6,010,768 A | 1/2000 | Yasue et al. | |
| 6,103,992 A * | 8/2000 | Noddin | 219/121.71 |
| 6,217,988 B1 | 4/2001 | Yasue et al. | |
| 6,228,511 B1 | 5/2001 | Sachdev et al. | |
| 6,251,502 B1 | 6/2001 | Yasue et al. | |
| 6,266,874 B1 | 7/2001 | DiStefano et al. | |
| 6,323,439 B1 * | 11/2001 | Kambe et al. | 174/262 |
| 6,376,052 B1 | 4/2002 | Asai et al. | |
| 6,664,485 B2 * | 12/2003 | Bhatt et al. | 174/264 |
| 6,729,019 B2 | 5/2004 | Grube et al. | |
| 6,826,830 B2 | 12/2004 | Egitto et al. | |
| 6,829,823 B2 | 12/2004 | Downes et al. | |
| 6,930,258 B1 | 8/2005 | Kawasaki et al. | |
| 2002/0179335 A1 | 12/2002 | Curcio et al. | |
| 2006/0191708 A1 * | 8/2006 | Kawasaki et al. | 174/255 |

FOREIGN PATENT DOCUMENTS

| | | |
|---|---|---|
| CN | 1173108 A | 2/1998 |
| CN | 1182345 A | 5/1998 |
| CN | 1182660 A | 5/1998 |
| CN | 1199536 C | 4/2005 |
| JP | 3-85686 | 8/1991 |
| JP | 07-283538 A | 10/1995 |
| JP | 7-283539 | 10/1995 |
| JP | 09-130050 | 5/1997 |
| JP | 09-148748 A | 6/1997 |
| JP | 09-153680 A | 6/1997 |
| JP | 09-181415 | 7/1997 |
| JP | 09-260849 | 10/1997 |
| JP | 9-321434 | 12/1997 |
| JP | 9-331152 | 12/1997 |
| JP | 10-51146 | 2/1998 |
| JP | 10-200265 | 7/1998 |
| JP | 10-322024 A | 12/1998 |
| JP | 10-334499 | 12/1998 |
| JP | 11-040949 A | 2/1999 |
| JP | 11-177237 A | 7/1999 |
| JP | 11-199759 | 7/1999 |
| JP | 11-204944 | 7/1999 |
| JP | 11-214846 | 8/1999 |
| JP | 11-266078 | 9/1999 |
| JP | 2000-165046 | 6/2000 |
| JP | 2000-244129 | 9/2000 |
| JP | 2000-299562 | 10/2000 |
| KR | 1998-7001202 | 4/1998 |
| TW | 323432 | 12/1997 |
| WO | WO 96/17503 | 6/1996 |
| WO | WO 97/16056 | 5/1997 |

OTHER PUBLICATIONS

Patent Abstracts of Japan, 09-331152, Dec. 22, 1997, Kawahara Takeo, Manufacture of Circuit Board.

Patent Abstracts of Japan, 11-266078, Sep. 28, 1999, Asai Motoo, Through-Hole Filing Resin Composition and Multilayer Printed Wiring Board.

Patent Abstracts of Japan, 06-283847, Jul. 10, 1994, Ishigami Fumio, Printed Wiring Board.

Patent Abstracts of Japan, 11-087930, Mar. 30, 1999, Isao Hiroyuki, Manufacture of Multilayered Printed Circuit Board.

Patent Abstracts of Japan, 11-266079, Sep. 28, 1999, Kitamura Naoya, Buildup Multilayer Wiring Board and Manufacture Thereof.

Patent Abstracts of Japan, 11-261216, Sep. 24, 1999, Kondo Mitsuhiro, Printed Wiring Board and Its Manufacture.

* cited by examiner

Fig. 3
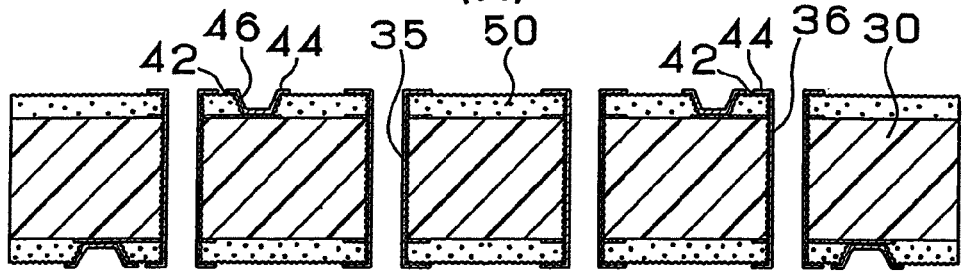
(A)
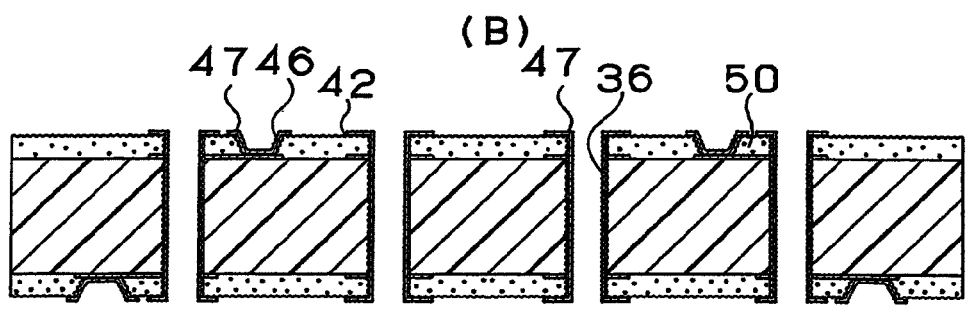
(B)
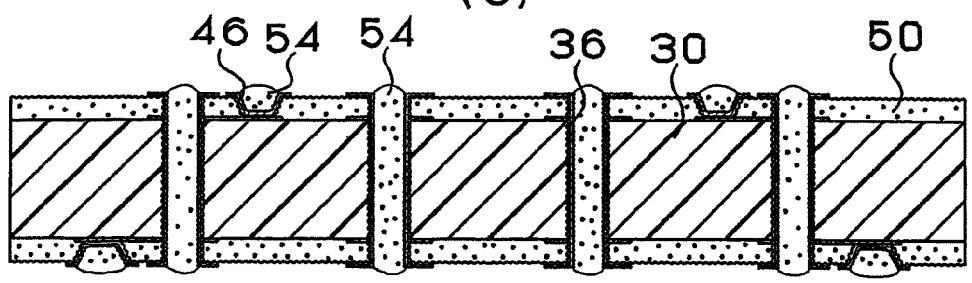
(C)
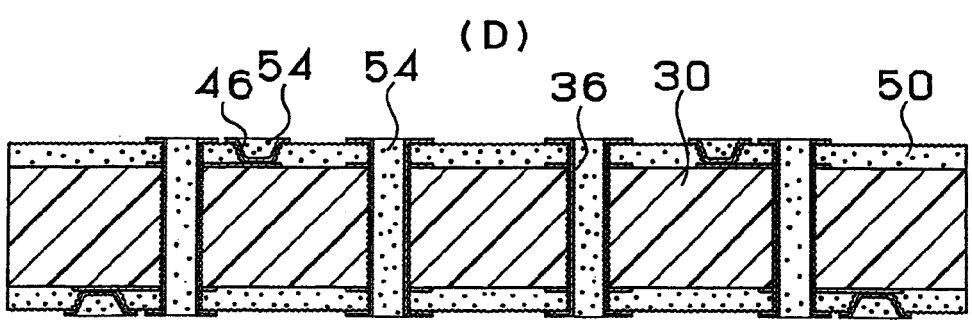
(D)

Fig. 7

|  | Embodiment | Comparison Example |
|---|---|---|
| Electrical connection characteristic | OK | NG |
| Separation | NO | YES |
| Expansion | NO | YES |

Fig. 12
(A)
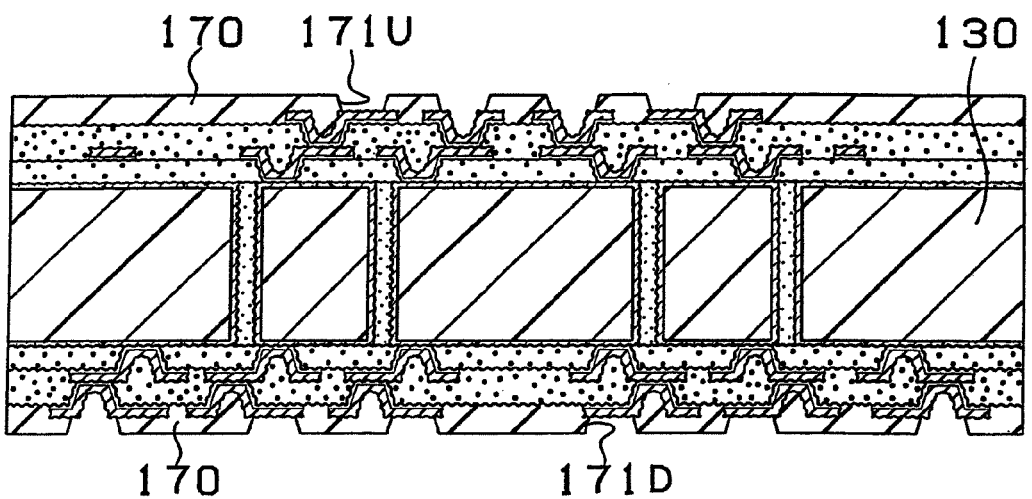
(B)
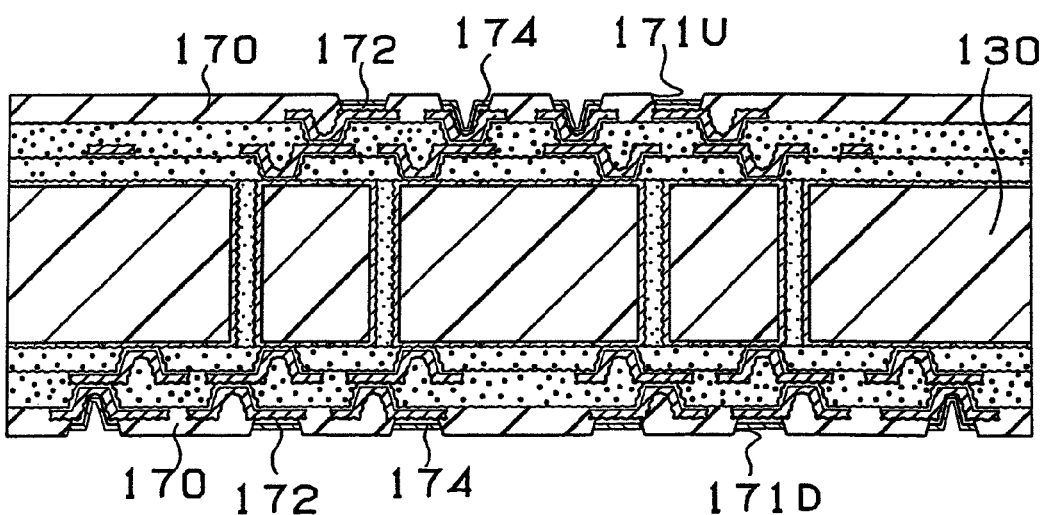

Fig. 18
(A)
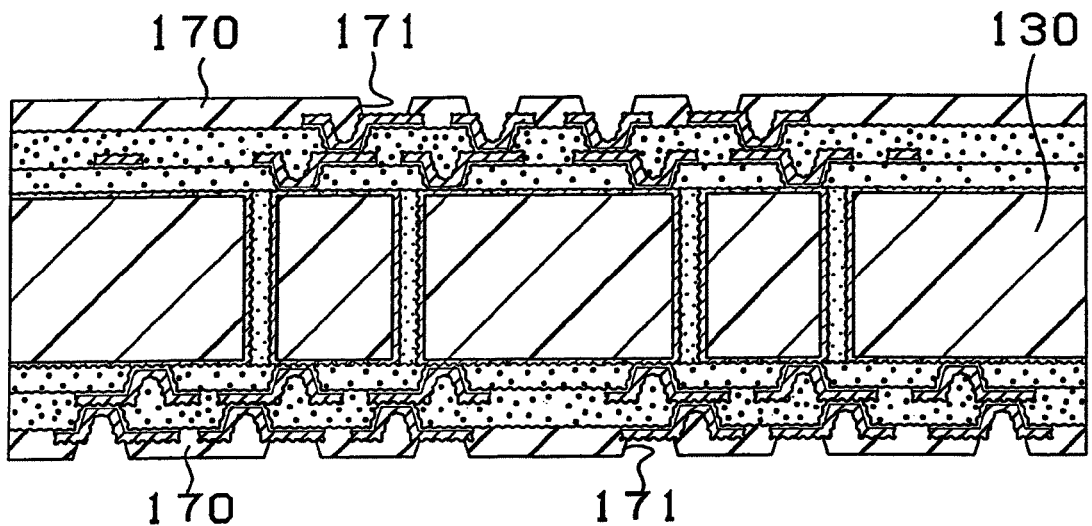
(B)
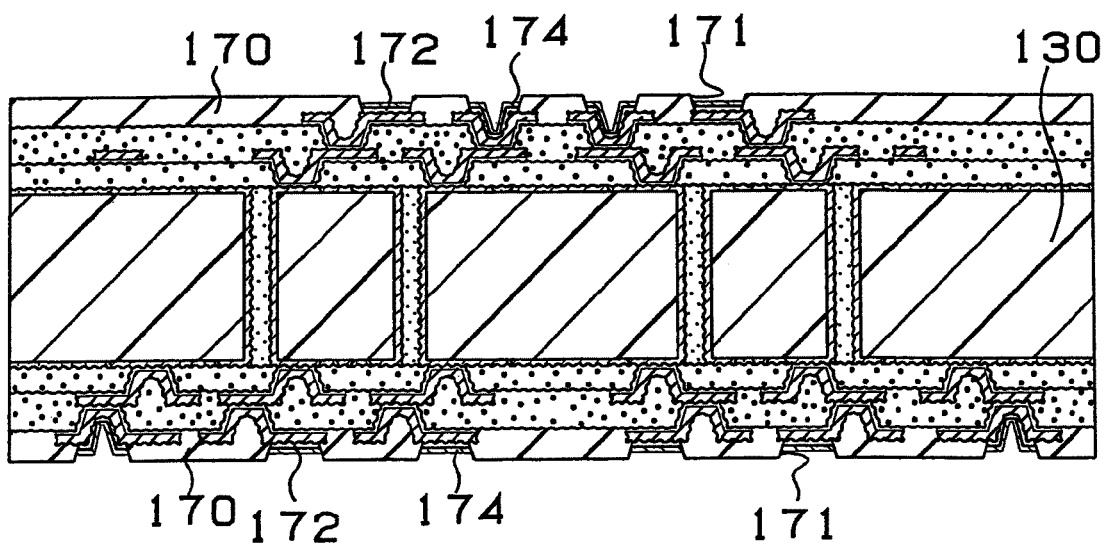

Fig. 21

|  | roughing method | polishing of through hole land surface | flow of resin filler out of through holes |
|---|---|---|---|
| Comparison example 5 | blackening-reduction process | No | Yes |
| Comparison example 6 | etching | No | Yes |
| Comparison example 7 | electroless plating | No | Yes |
| Second Embodiment | blackening-reduction process | Yes | No |
| First Modification of Second Embodiment | etching | Yes | No |
| Second Modification of Second Embodiment | electroless plating | yes | No |

MULTI-LAYER PRINTED CIRCUIT BOARD AND METHOD OF MANUFACTURING MULTI-LAYER PRINTED CIRCUIT BOARD

CROSS REFERENCE TO RELATED APPLICATION

This application is a continuation of and claims the benefit of priority under 35 U.S.C. §120 from U.S. Ser. No. 11/333,228, filed Jan. 18, 2006 which is a divisional of the U.S. Ser. No. 11/106,642, filed Apr. 15, 2005, now U.S. Pat. No. 7,178,234, issued Feb. 20, 2007, and is a divisional of U.S. Ser. No. 09/830,963, filed Jul. 6, 2001, now U.S. Pat. No. 6,930,258, issued Aug. 16, 2005, which is a national state of PCT/JP00/07037, filed Oct. 10, 2000, and claims priority under 35 U.S.C. §119 to Japanese Patent Application No. 11-303305, filed Oct. 26, 1999; 11-303306, filed Oct. 26, 1999; 11-303307, filed Oct. 26, 1999; and 2000-029988, filed Feb. 8, 2000.

TECHNICAL FIELD

The present invention relates to a multi-layer printed circuit board having buildup layers formed on the both sides of a core substrate, the buildup layers each having interlayer resin insulating layers and conductor layers alternately provided, the conductor layers connected to one another by via holes. More particularly, the present invention relates to a multi-layer printed circuit board and a method of manufacturing a multi-layer printed circuit board which can be employed as a package substrate on which IC chips can be mounted.

BACKGROUND ART

Hitherto, a buildup multi-layer printed circuit board has been manufactured by a method disclosed by, for example, Japanese Patent Laid-Open No. 9-130050.

A rough layer is formed on the surface of the conductor circuit of a printed circuit board by electroless plating or etching. Then, an interlayer insulating resin is applied, exposed and developed by a roll coater or printing, via hole opening portions are formed for making layers continuous, and an interlayer resin insulating layer is formed through UV hardening, actual hardening and the like. Further, a catalyst such as palladium is applied on to the interlayer resin insulating layer on the rough surface which has been subjected to a roughening process with an acid or an oxidizer. A thin electroless plated film is formed, a pattern is formed on the plated film by a dry film and the thickness of the pattern is increased by electroplating. Thereafter, the dry film is separated and removed by an alkali and etched to thereby form a conductor circuit. By repeating the above processes, a buildup multi-layer printed circuit board is obtained.

At present, as the frequency of IC chips becomes higher, demand for accelerating the transmission speed of a multi-layer printed circuit board rises. To deal with such demand, the applicant of the present invention proposed Japanese Patent Laid-Open No. 10-334499. With this constitution, linear wirings are provided by arranging via holes 346 of a lower interlayer resin insulating layer 350 and via holes 366 of an upper interlayer resin insulating layer 360 right above through holes 336, thereby shortening wiring lengths and accelerating signal transmission speed.

It was discovered, however, that with the above constitution, the via holes 346 of the lower interlayer resin insulating layer 350 and the via holes 366 of the upper interlayer resin insulating layer 360 are separated from one another under heat cycle conditions. The inventor of the present invention investigated the cause of separation and discovered that the via holes 366 in the upper layer are influenced by the shapes of the surfaces of the via holes 346 of the lower layer and the connection characteristic of the via holes 366 deteriorates. Further, it is estimated that since the interlayer resin insulating layers 350 and 360 are not reinforced by core materials such as glass cloth, these layers tend to be separated in a heat cycle rather than a core substrate provided with a core material.

The present invention has been made to overcome the foregoing problems, and it is, therefore, an object of the present invention to provide a multi-layer printed circuit board and a method of manufacturing a multi-layer printed circuit board capable of shortening internal wiring lengths and having excellent connection reliability.

It is a still further object of the present invention to provide a manufacturing method capable of manufacturing a multi-layer printed circuit bard at low cost.

Meanwhile, a resin is filled in through holes so as to enhance reliability for a buildup multi-layer printed circuit board. When filling the resin, blackening-reduction processes are conducted to the surfaces of the through holes and rough layers are provided thereon so as to increase adhesiveness. In addition, as the density of the multi-layer printed circuit board increases, through holes are made smaller in size. Following this, resin filler having low viscosity is employed to be filled in the through holes.

As prior art for forming a rough layer on a through hole and filling the through hole with resin filler, it is described in Japanese Patent Laid-Open No. 9-181415 that a copper oxide layer is formed in a through hole, the through hole is filled with resin filler and then an interlayer insulating layer is formed. It is also described in Japanese Patent Laid-Open No. 9-260849 that after forming a rough layer in a through hole by etching, the through hole is filled with resin filler and then an interlayer insulating layer is formed.

If using resin filler having low viscosity, however, the resin filler is dented in the through hole, causing disconnection and the like during the formation of wirings on an upper layer. The inventor of the present invention investigated the cause of disconnection and discovered that this is because the resin out of filler and the resin which constitute resin filler flow along the rough layer (very small anchor) formed on the land of the through hole. As a result, the filler within the through hole is dented, making it impossible to flatten and smooth a core substrate. Due to this, it was discovered that if manufacturing a multi-layer printed circuit board by forming an interlayer resin insulating layer and wirings on a core substrate, the resultant multi-layer resin insulating layer is susceptible to disconnection and a probability of generating defects increases.

The present invention has been made to solve the foregoing problems and it is, therefore, a still further object of the present invention to provide a method of manufacturing a multi-layer printed circuit board having enhanced wiring reliability.

In the meantime, a substrate on which a resin film for the interlayer resin insulating layer of a resin substrate serving as a core material is bonded, is employed as a core substrate. Through holes for penetrating the substrate are filled with resin filler. Further, an interlayer resin insulating layer is formed and via holes are formed therein. The above-stated resin filler, however, had some defects.

First, if a reliability test such as a heat cycle is conducted to a printed circuit board filled with filler, conductors sometimes crack in the vicinity of the boundary between the resin substrate and the resin film. Second, after filling the filler, a resin film serving as an interlayer resin insulating layer cracks in a polishing step conducted to flatten the board. Third, if a plated cover is formed right on the through hole, the reaction of the plated film may stop. Thus, even if via holes are formed right above the through holes, electrical connection cannot be established.

As a result of these three defects, a printed circuit board with deteriorated reliability and reduced electrical connection characteristics is provided.

It is a still further object of the present invention to provide a printed circuit board and a method of manufacturing a printed circuit board capable of solving these defects.

DISCLOSURE OF THE INVENTION

In order to solve the above problems, a multi-layer printed circuit board according to the first embodiment of the present invention is characterized by having buildup layers formed on both sides of a core substrate, the buildup layers each having interlayer resin insulating layers and conductive layers alternately provided, the conductor layers connected to one another by via holes, wherein through holes are formed to penetrate said core substrate and the interlayer resin insulating layers formed on the both sides of the core substrate; and the via holes are formed right on said through holes, the via holes connected to external connection terminals.

In the second embodiment of the present invention, the multi-layer printed circuit board according to the first embodiment of the present invention, wherein resin filler is filled in said through holes and the conductor layers are formed to cover exposed surfaces of the resin filler from the through holes; and the via holes right on said through holes are formed on said conductor layers of said through holes.

According to the third embodiment of the present invention, a method of manufacturing a multi-layer printed circuit board comprising at least the following steps (a) to (d):

(a) forming lower interlayer resin insulating layers on both sides of a core substrate, respectively;

(b) forming through holes penetrating said core substrate and said lower interlayer resin insulating layers;

(c) forming upper interlayer resin insulating layers on said lower interlayer resin insulating layers, respectively; and (d) forming via holes in said upper interlayer resin insulating layers, the via holes connected to external connection terminals and formed right on part of said through holes.

According to the fourth embodiment of the present invention, a method of manufacturing a multi-layer printed circuit board comprising at least the following steps (a) to (g):

(a) forming lower interlayer resin insulating layers on both sides of a core substrate, respectively;

(b) forming through holes penetrating said core substrate and said lower interlayer resin insulating layers;

(c) filling resin filler in said through holes;

(d) polishing and flattening the resin filler pouring from said through holes;

(e) forming conductor layers covering exposed surfaces of said resin filer from said through holes;

(f) forming upper interlayer resin insulating layers on said lower interlayer resin insulating layers, respectively; and (g) forming via holes in said upper interlayer resin insulating layers and forming the via holes right on part of said through holes so as to be connected to external connection terminals.

According to the multi-layer printed circuit board of the first embodiment of the present invention and the method of manufacturing the multi-layer printed circuit board of the third embodiment of the present invention, the through holes are formed to penetrate the core substrate and the interlayer resin insulating layers formed on the both sides of the core substrate, and the via holes connected to external connection terminals are formed right on the through holes, respectively. Due to this, the through holes and the via holes are arranged linearly, thereby making it possible to shorten wiring length and accelerate signal transmission speed. Further, since the through holes and the via holes connected to the external connection terminals are directly connected to one another, connection reliability is excellent.

According to the multi-layer printed circuit board of the second embodiment of the present invention and the method of manufacturing the multi-layer printed circuit board of the fourth embodiment of the present invention, the through holes are formed to penetrate the core substrate and the interlayer resin insulating layers formed on the both sides of the core substrate, and the via holes are formed right on the through holes, respectively. Due to this, the through holes and the via holes are arranged linearly, thereby making it possible to shorten wiring length and accelerate signal transmission speed. Further, since the through holes and the via holes connected to the external connection terminals are directly connected to one another and the via holes are formed on the respective conductor layers covering the resin filler in the through holes which filler has been flattened by polishing, connection reliability is excellent.

According to the fifth embodiment of the present invention, a multi-layer printed circuit board having interlayer resin insulating layers on both sides of a core substrate, respectively, through holes provided to penetrate the core substrate and filled with resin filler, the interlayer resin insulating layers and conductor circuits provided, wherein said resin filler contains an epoxy resin, a curing agent and 10 to 50% of inorganic particles.

According to the sixth embodiment of the present invention, a multi-layer printed circuit board having interlayer resin insulating layers formed on both sides of a core substrate, respectively, through holes provided to penetrate the core substrate and filled with resin filler, plated covers provided, the interlayer resin insulating layers and conductor circuits provided, wherein said resin filler contains an epoxy resin, a curing agent and 10 to 50% of inorganic particles.

According to the seventh embodiment of the present invention, a multi-layer printed circuit board according to the fifth or sixth embodiment of the present invention, wherein said inorganic particles contain one type or more selected from a group consisting of aluminum compounds, calcium compounds, potassium compounds, magnesium compounds and silicon compounds.

First, since the quantity of the mixed inorganic particles is set appropriately, the coefficient of thermal expansion of the resin filler, that of the resin substrate forming the core substrate and those of the resin films for the interlayer resin insulating layers are matched to one another. Due to this, even on heat cycle conditions, a stress caused by heat contraction does not occur. Thus, cracking does not occur. Further, the resin films are impregnated with soluble particles for forming rough surfaces by a roughing process. Due to this, it was discovered that if the quantity of mixed inorganic particles exceeds 50%, the matching cannot be ensured.

Second, it was discovered that in the polishing step conducted to flatten the filler after the filler is filled, the filler can be easily polished. It was discovered that if the quantity of mixed inorganic particles exceeds 50%, the filler can be flattened only by mechanical polishing using abrasive paper. The resin films on the surface layers of the core substrate are not impregnated with a reinforcing material such as glass epoxy and inferior, in strength, to the resin substrate. Due to this, if mechanical polishing with abrasive paper (such as belt sander polishing) is conducted, the resin films cannot resist the polishing. As a result, the resin films crack. Besides, the resin films are damaged, thereby detaching soluble particles. Consequently, even if the rough surfaces are formed, they are not what are desired. Considering this, if a polishing process is performed, the surface layers of the core substrate are traced with a nonwoven fabric containing a polishing material such as a buff, thereby removing and flattening the resin filler.

Third, it was discovered that in the formation of plated covers right on the respective through holes, if an inorganic particle content exceeds 50%, the quantity of added catalyst decreases and the reaction of the plated films stops. The coordinate bond between the inorganic particles and the catalyst does not occur. The quantity of added catalyst, therefore, decreases. Further, in the formation of the plated films, if the quantity of inorganic particles is excessive, a plating solution tends not to be contacted, thereby stopping the reaction of the plated films.

If the quantity of mixed inorganic particles is less than 10%, the effect of matching the coefficients of thermal expansion is not expected. As a result, if the resin filler is filled, the resin filler is not left in the through holes and flows away from the other side.

It is more preferable that the mixture ratio of inorganic particles is 20 to 40%. In that range, even if particles flocculate, the above-stated defects can be avoided.

According to the eighth embodiment of the present invention, a multi-layer printed circuit board according to the fifth or sixth embodiment of the present invention, wherein a shape of said inorganic particles is one of a spherical shape, a circular shape, an ellipsoidal shape, a pulverized shape and a polygonal shape.

Preferably, the particles are circular, ellipsoidal or the like without angular surfaces. This is because cracks resulting from such particles do not occur. It is also preferable that the particle diameter of the inorganic particles is in a rage of 00.1 to 5 .mu.m. If the particle diameter is less than 0.01 .mu.m, the particles are offset one another when the resin filler is filled. If exceeding 5 .mu.m, it is often difficult to adjust the mixture ratio of the inorganic particles in the resin.

In the ninth embodiment of the present invention, a multi-layer printed circuit board according to the fifth or sixth embodiment of the present invention, wherein rough layers are provided on the conductor layers of said through holes, respectively.

It is preferable that rough layers are provided on the conductor layers of the through holes, respectively. By doing so, it is possible to prevent the resin filler from expanding and contracting, whereby the interlayer resin insulating layers and the plated covers formed on the respective through holes are not pushed up. The rough layers are formed by an oxidization-reduction process, a blackening process or a plating process as well as by an etching process.

According to the tenth embodiment of the present invention, a method of manufacturing a multi-layer printed circuit board having interlayer resin insulating layers provided on both sides of a core substrate, for forming the interlayer resin insulating layers through the following steps (a) to (e):

(a) a formation step of forming through holes penetrating the both sides of the printed circuit board;

(b) a filling step of filling resin filler containing an epoxy resin and 10 to 50 % of inorganic particles;

(c) a drying step and a polishing step;

(d) a hardening step; and (e) a cover plating step.

In the eleventh embodiment of the present invention, a method according to the tenth embodiment of the present invention, wherein in said polishing step (c), a buffing step is conducted at least once or a plurality of times.

In the twelfth embodiment of the present invention, a method according to the tenth or eleventh embodiment of the present invention, wherein in said step (a), a step of forming rough layers is conducted.

In order to achieve the above problems, in the thirteen embodiment of the present invention, a multi-layer printed circuit board having buildup layers on both sides of a core substrate, respectively, said buildup layer having interlayer resin insulating layers and conductor layers alternately provided, the conductor layers connected to one another by via holes, wherein through holes filled with resin filler are formed to penetrate said core substrate and lower interlayer resin insulating layers formed on the both sides of the core substrate; and via holes filled with said resin filler are formed in said lower interlayer resin insulating layers.

In case of the multi-layer printed circuit board of the thirteen embodiment of the present invention, the through holes and the via holes are filled with the same resin filler. Due to this, the multi-layer printed circuit board can be manufactured at low cost and the strength within the through holes and that within the via holes can be kept uniform, thereby making it possible to enhance the reliability of the multi-layer printed circuit board.

The resin may be a thermosetting resin which means an epoxy resin, a phenol resin, a fluorocarbon resin, a triazine resin, a polyolefin resin, a polyphenylene ether resin and the like, a thermoplastic resin or a complex thereof. Inorganic filler, such as silica or alumina, may be contained in the resin to adjust the coefficient of thermal expansion of the resin. A paste mainly consisting of metal filler such as a conductive resin, gold or silver may be employed. The complexes thereof may be employed, as well.

In the fourth embodiment of the present invention, a multi-layer printed circuit board according to the thirteen embodiment of the present invention, wherein the conductor layers are formed to cover exposed surfaces of the resin filler filled in the via holes of said lower interlayer resin insulating layers; and via holes are formed right on the via holes through the conductive layers, respectively.

According to the fourteenth embodiment of the present invention, the conductor layers covering the exposed surfaces of the filler filled in the via holes of the lower interlayer resin insulating layers are formed and the via holes are formed right on the via holes through the conductor layers, respectively. Due to this, the lower via holes can be formed flat and the adhesiveness between the lower via holes and the via holes formed on the corresponding via holes can be enhanced to thereby enhance the reliability of the multi-layer printed circuit board.

According to the fifteenth embodiment of the present invention, a method of manufacturing a multi-layer printed circuit board comprising at least the following steps (a) to (g):

(a) forming lower interlayer resin insulating layers on both sides of a core substrate, respectively;

(b) forming penetrating holes in said core substrate and said lower interlayer resin insulating layers, the penetrating holes becoming through holes;

(c) forming openings in said lower interlayer resin insulating layers, the openings becoming via holes;

(d) forming conductive films in said penetrating holes and said openings to thereby provide the through holes and the via holes, respectively;

(e) filling resin filler in said through holes and said via holes;

(f) polishing and flattening the resin filler pouring out of said through holes and said via holes; and (g) forming conductor layers covering exposed surfaces of said resin filler from said through holes and said via holes, respectively.

According to the sixteenth embodiment of the present invention, a method of manufacturing a multi-layer printed circuit board comprising at least the following steps (a) to (i):

(a) forming lower interlayer resin insulating layers on both sides of a core substrate, respectively;

(b) forming penetrating holes in said core substrate and said lower interlayer resin insulating layers, the penetrating holes becoming through holes;

(c) forming openings in said lower interlayer resin insulating layers, the openings becoming via holes;

(d) forming conductive films in said penetrating holes and said openings to provide the through holes and the via holes;

(e) filling resin filler in said through holes and said via holes;

(f) polishing and flattening the resin filler pouring out of said through holes and said via holes;

(g) forming conductor layers covering exposed surfaces of said resin filler from said through holes and said via holes;

(h) forming upper interlayer resin insulating layers on said lower interlayer resin insulating layers, respectively; and (i) forming via holes in said upper interlayer resin insulating layers and right on part of said via holes.

According to the method of manufacturing the multi-layer printed circuit board of the fifteenth or sixteenth embodiment of the present invention, the same resin filler is filled in the through holes and the via holes and polished simultaneously. Due to this, the multi-layer printed circuit board can be manufactured at low cost and the strength within the through holes and that within the via holes can be kept uniform, so that the reliability of the multi-layer printed circuit board can be enhanced. Further, since the upper via holes are formed on the conductor layers covering the filler within the via holes which filler has been polished and thereby flattened, respectively, connection reliability is excellent.

In order to achieve the above problems, according to the seventeenth embodiment of the present invention, a method of manufacturing a multi-layer printed circuit board comprising at least the following steps (a) to (e):

(a) forming lower interlayer resin insulating layers on both sides of a core substrate, respectively;

(b) forming penetrating holes in said core substrate and said lower interlayer resin insulating layers, the penetrating holes becoming through holes;

(c) forming openings in said lower interlayer resin insulating layers, the openings becoming via holes;

(d) conducting a de-smear process to said penetrating holes by an acid or an oxidizer and conducting a roughing process to surfaces of the lower interlayer resin insulating layers; and (e) forming conductive films on said penetrating holes and said openings to provide the through holes and the via holes, respectively.

According to the method of manufacturing the multi-layer printed circuit board of the seventeenth embodiment of the present invention, the de-smear process for the penetrating holes by employing an oxidizer and the roughing process for the surfaces of the lower interlayer resin insulating layers are performed simultaneously. Due to this, it is possible to reduce the number of manufacturing steps and to manufacture the multi-layer printed circuit board at low cost.

In the eighteenth embodiment of the present invention, a method according to the seventeenth embodiment of the present invention, wherein said core substrate is made of one of a glass epoxy resin, an FR4 resin, an FR5 resin and a BT resin;

each of said lower interlayer resin insulating layers contains at least one of an epoxy resin, a phenol resin, a polyimide resin, a polyphenylene resin, a polyolefin resin and a fluorocarbon resin; and said oxidizer contains one of a chromic acid and permanganate.

According to the eighteenth embodiment of the present invention, the core substrate is made of one of a glass epoxy resin, a FR4 resin, a FR5 resin and a BT resin. Each of the lower interlayer resin insulating layers contains at least one of an epoxy resin, a phenol resin, a polyimide resin, a polyphenylene resin, a polyolefin resin and a fluorocarbon resin. The oxidizer contains one of a chromic acid and permanganate. Due to this, it is possible to simultaneously perform the de-smear process for the penetrating holes for forming the lower interlayer resin insulating layers on the core substrate and the roughing process for the lower interlayer resin insulating layers.

In order to achieve the above problems, according to the twenty first embodiment of the present invention, a method of manufacturing a multi-layer printed circuit board comprising at least the following steps (a) to (d):

(a) forming through holes in a core substrate;

(b) forming rough layers on said through holes, respectively;

(c) polishing and flattening surfaces of lands of said through holes; and (d) filling resin filler in said through holes and forming resin layers.

According to the twenty first embodiment of the present invention, after forming the rough layers on the through holes, respectively, the surfaces of the lands of the through holes are polished and flattened. By doing so, it is possible to prevent the resin filler from flowing out along the rough layers (anchors) formed on the lands of the through holes when filling the resin filler in the through holes. Thus, it is possible to smoothly form the filler in the through holes and to enhance the reliability of wirings formed above the through holes.

In the twenty second embodiment of the present invention, a method according to the twenty first embodiment of the present invention, wherein said rough layers are copper oxide layers.

In the twenty third embodiment of the present invention, a method according to the twenty first embodiment of the present invention, wherein said rough layers are formed by etching.

In the twenty fourth embodiment of the present invention, a method according to the twenty first embodiment of the present invention, wherein said rough layers are needle alloy layers made of copper-nickel-phosphorous.

According to the twenty second, twenty third or twenty fourth embodiment of the present invention, the rough layer formed on each through hole is preferably formed by one of the formation of a copper oxide layer by a blackening-reduction process, the formation of a needle alloy layer consisting of copper-nickel-phosphorous and by etching. By doing so, it is possible to enhance the adhesiveness between the conductor layers on the inner walls of the through holes and the resin filler.

In the twenty fifth embodiment of the present invention, a method according to the twenty first embodiment of the present invention, wherein said resin filler is one selected from a group consisting of a mixture of an epoxy resin and organic filler, a mixture of an epoxy resin and inorganic filler and a mixture of an epoxy resin and inorganic fiber.

According to the twenty fifth embodiment of the present invention, the resin filler to be employed is preferably one selected from a group consisting of a mixture of an epoxy resin and organic filler, a mixture of an epoxy resin and inorganic filler and a mixture of an epoxy resin and inorganic filler. By doing so, it is possible to adjust the coefficients of thermal expansion between the resin filler and the core substrate.

BRIEF DESCRIPTION OF DRAWINGS

FIG. 3 is a diagram showing a process for manufacturing the multi-layer printed circuit board according to the first embodiment;

FIG. 7 is a table showing the evaluation results of the first embodiment and Comparison;

FIG. 12 is a diagram showing a process for manufacturing the multi-layer printed circuit board according to the second embodiment;

FIG. 18 is a diagram showing a process for manufacturing the multi-layer printed circuit board according to the first modification of the second embodiment;

FIG. 21 is a table showing the estimation result of the embodiments of the present invention and Comparisons.

BEST MODE FOR CARRYING OUT THE INVENTION

First Embodiment

The embodiments of the present invention will be described hereinafter with reference to the accompanying drawings.

Figure 6:
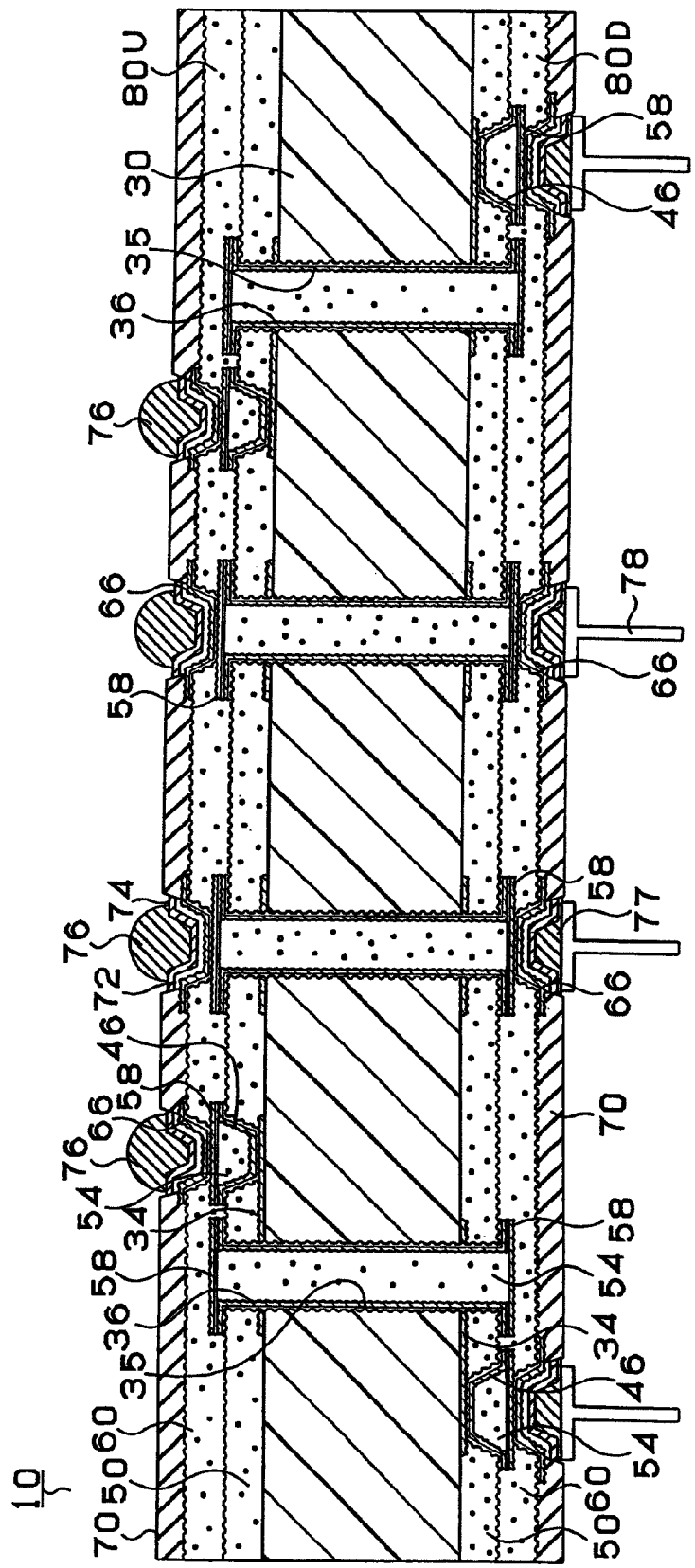
FIG. 6 is a cross-sectional view of the multi-layer printed circuit board according to the first embodiment.
Figure 8:
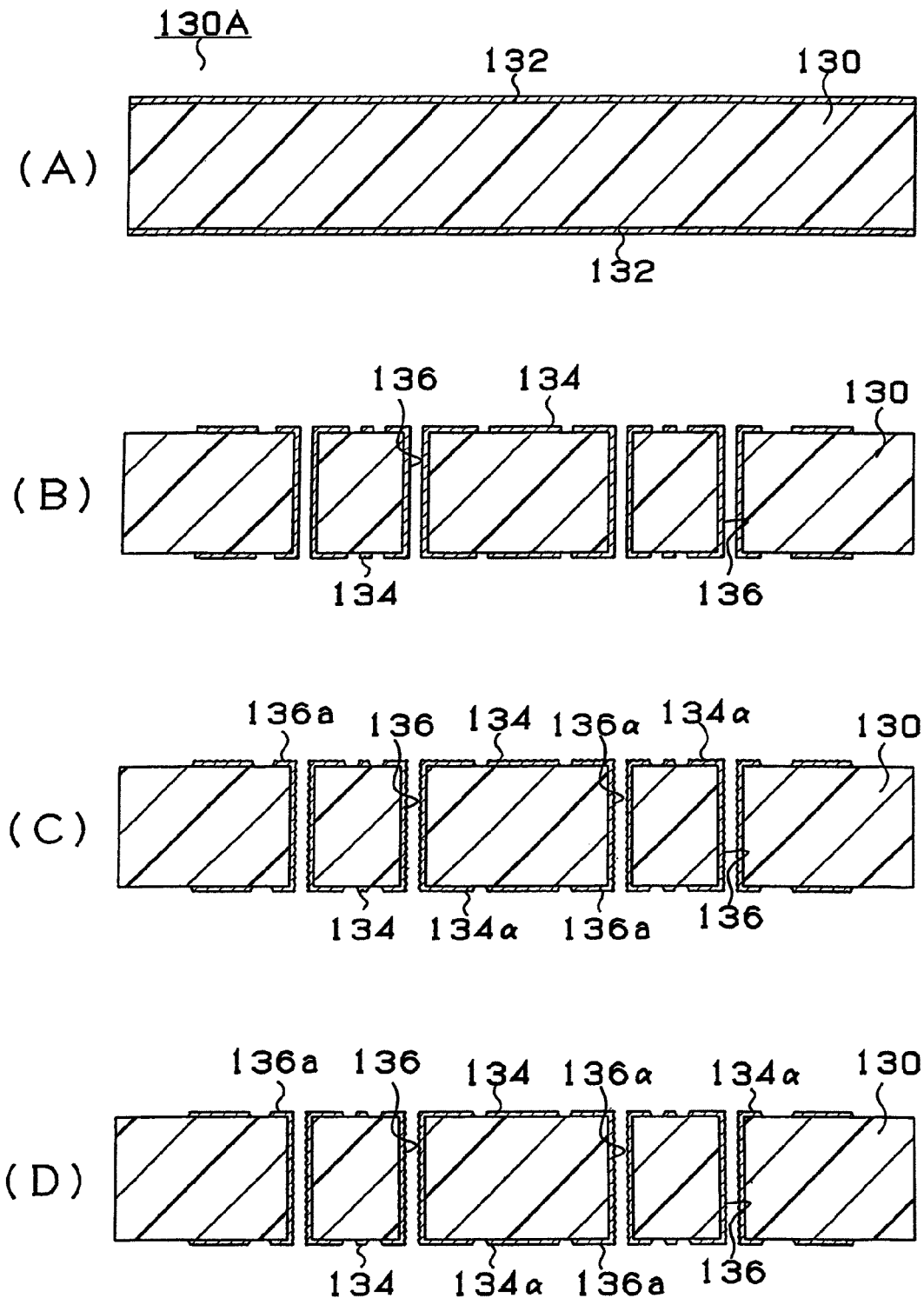
FIG. 8 is a diagram showing a process for manufacturing a multi-layer printed circuit board according to the second embodiment of the present invention.
Figure 9:
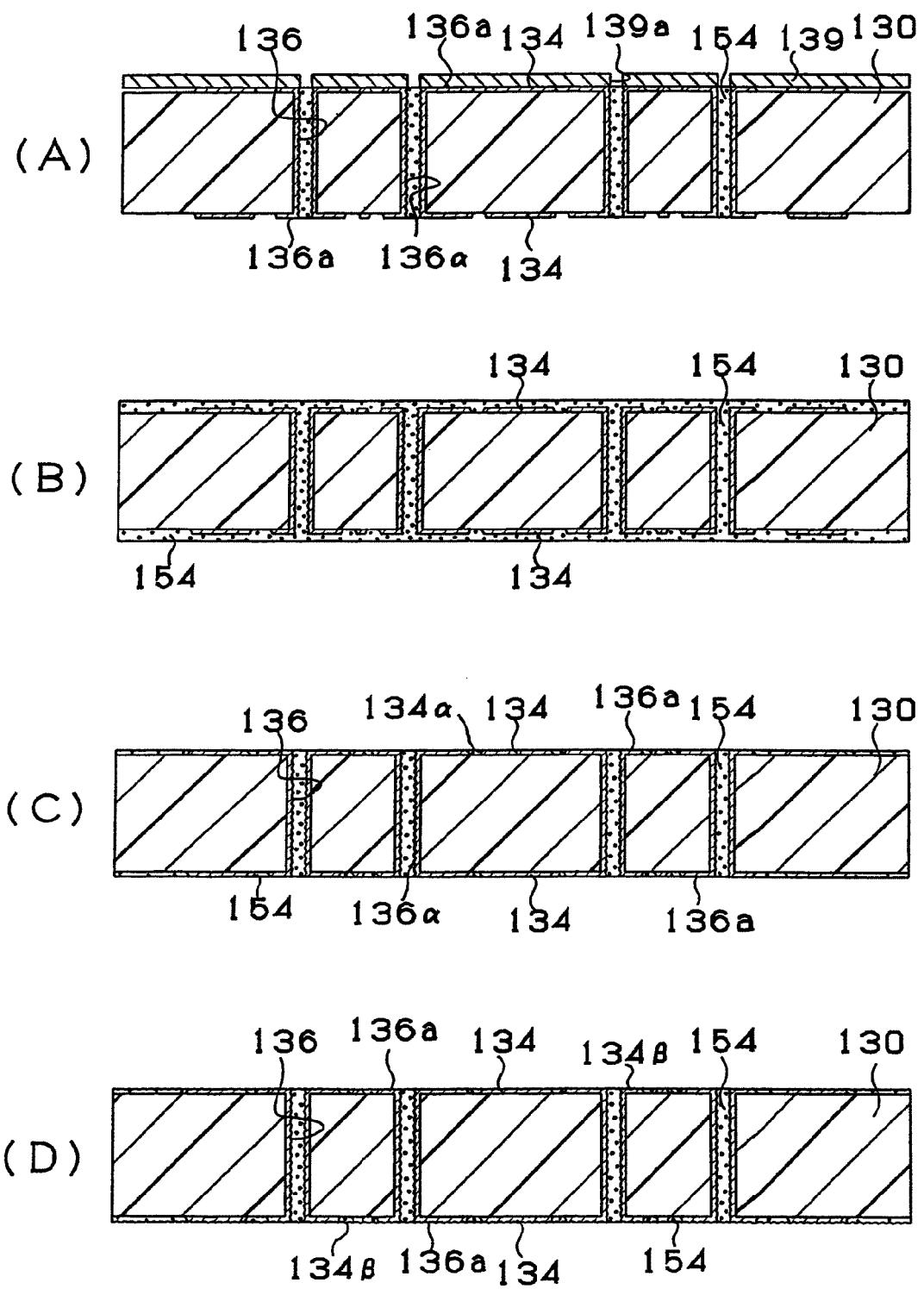
FIG. 9 is a diagram showing a process for manufacturing the multi-layer printed circuit board according to the second embodiment.
Figure 10:
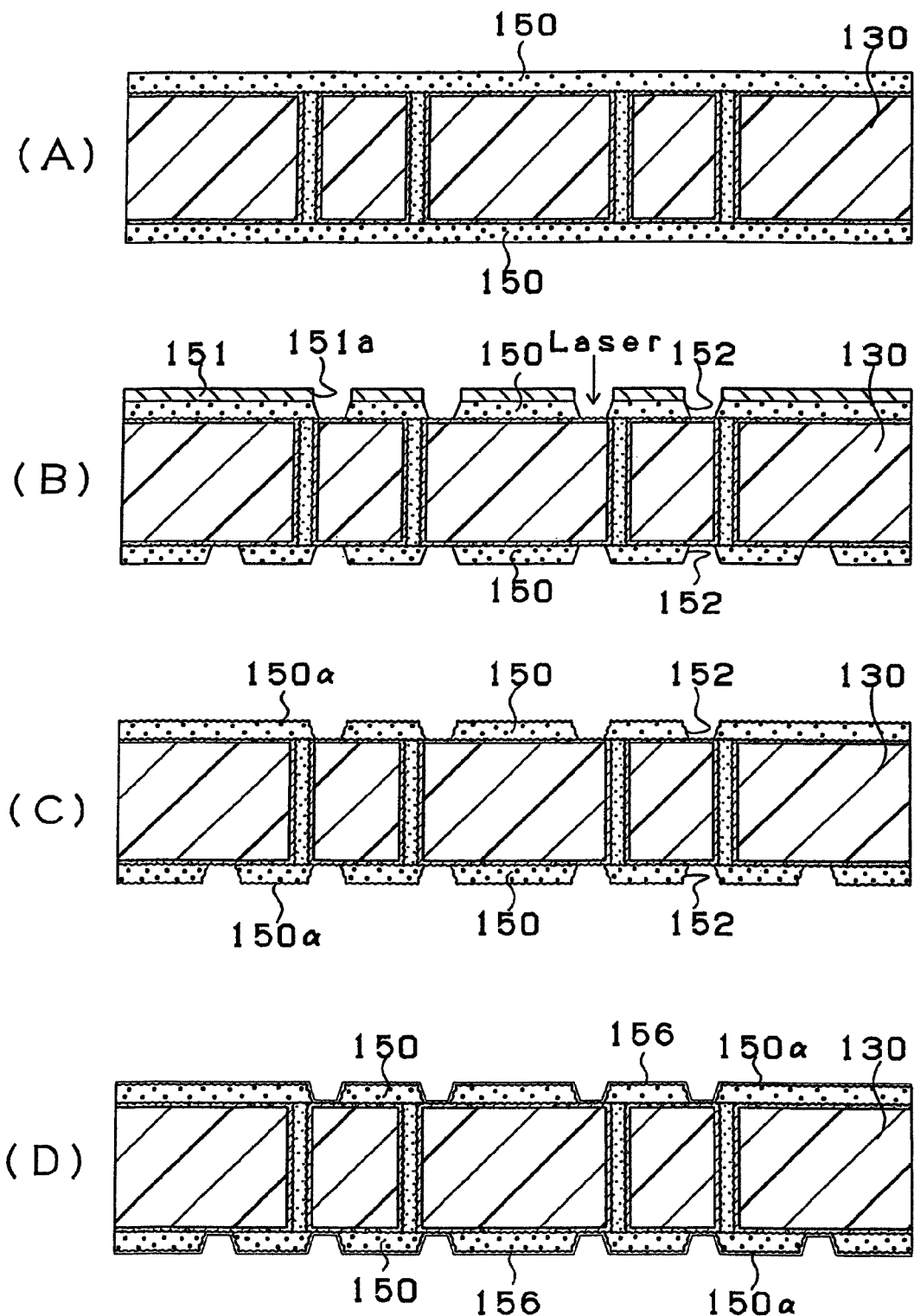
FIG. 10 is a diagram showing a process for manufacturing the multi-layer printed circuit board according to the second embodiment.
Figure 11:
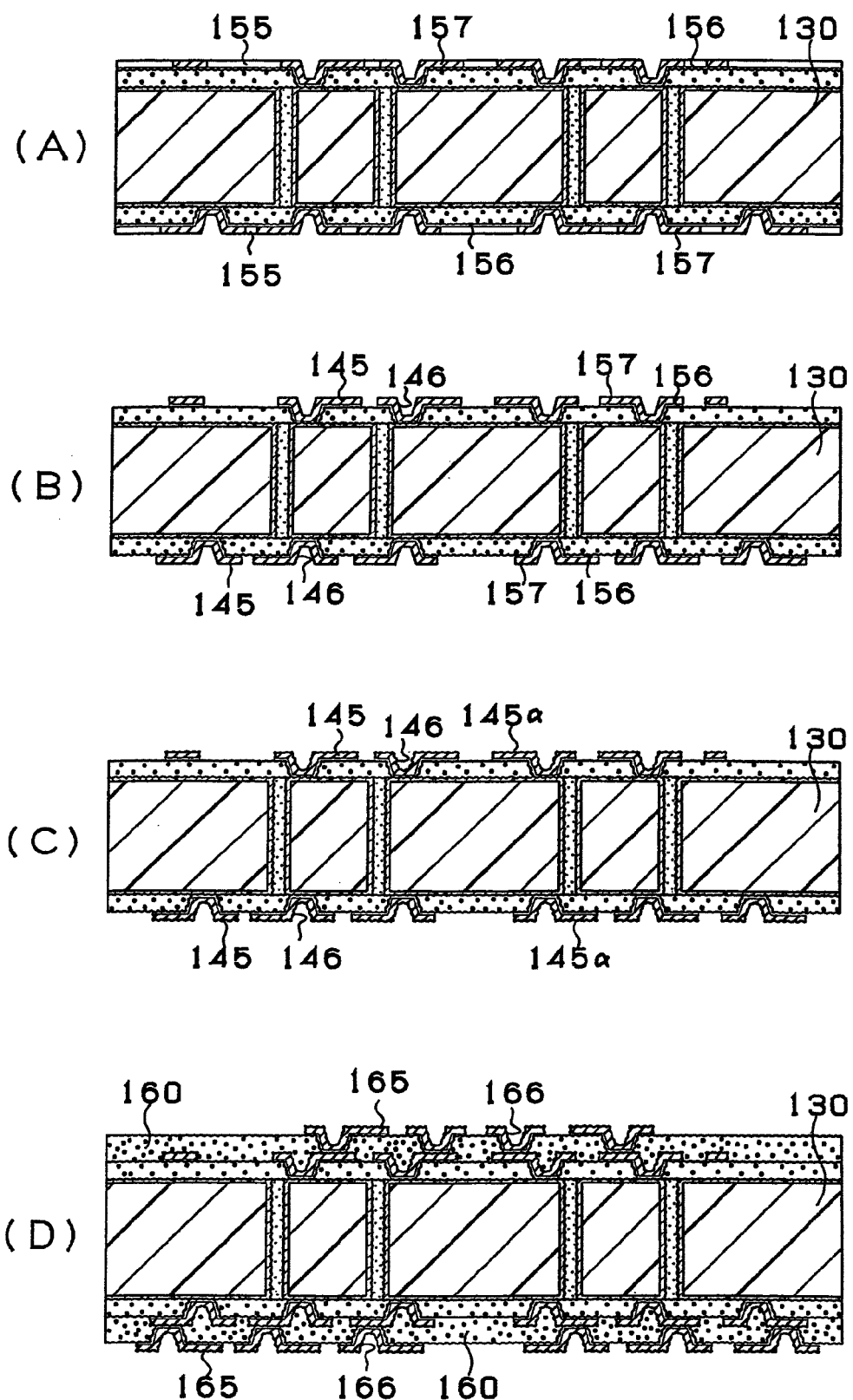
FIG. 11 is a diagram showing a process for manufacturing the multi-layer printed circuit board according to the second embodiment.

First, the constitution of a multi-layer printed circuit board according to the first embodiment of the present invention will be described with reference to FIG. 6 showing a longitudinal sectional view.

As shown in FIG. 6, a multi-layer printed circuit board 10 has a core substrate 30 having right and reverse sides on which buildup wiring layers 80U and 80D are formed, respectively. Each of the buildup wiring layers 80U and 80D consists of a lower interlayer resin insulating layer 50 in which via holes 46 are formed, an upper interlayer resin insulating layer 60 in which upper via holes 66 are formed, and a solder resist layer 70 formed on the upper interlayer resin insulating layer 60. A solder bump (external connection terminal) 76 for connecting the board 10 to an IC chip (not shown) is formed on each of the upper via holes 66 through the opening portion 71 of the solder resist 70. A conductive connection pin (external connection terminal) 78 for connecting the circuit board 10 to a daughter board (not shown) is connected to each of the lower via holes 66.

In the first embodiment, through holes 36 connecting the buildup wiring layers 80U and 80D to each other are formed to penetrate a core substrate 30 and the lower interlayer resin insulating layers 50. Resin filler 54 is filled in the through holes 36 and plated covers 58 are provided onto the opening portions of the holes 36. Likewise, resin filler 54 is filled in the via holes 46 formed in the lower interlayer resin insulating layer 50 and plated covers 58 are provided onto the opening portions of the via holes 46.

In the first embodiment, the through holes 36 are formed to penetrate the core substrate 30 and the lower interlayer resin insulating layers 50 and the via holes 66 are formed right on the through holes 36, respectively. Due to this, each through hole 36 and each via hole 66 are arranged linearly to thereby make it possible to shorten wiring length and to accelerate signal transmission speed. Further, since the through holes 36 are directly connected to the via holes 66 connected to the external connection terminals (solder bumps 76, conductive connection pins 78), excellent connection reliability is obtained. In the first embodiment, as will be described later, the filler 54 filled in the through holes 36 is flattened by polishing and then the plated covers (conductive layers) 58 covering the filler 54 are arranged and the via holes 66 are formed thereon. Due to this, the surfaces of the through holes 36 have high flatness and reliability in the connection between the through holes 36 and the corresponding via holes 66 is excellent.

Furthermore, in case of the multi-layer printed circuit board in the first embodiment, the through holes 36 and the lower via holes 46 are filled with the same resin filler 54 and the resin filler 54 is simultaneously polished and flattened as will be described later. Thus, the multi-layer printed circuit board can be manufactured at low cost and the strength of the interiors of the through holes and that of the interiors of the via holes can be kept uniform, so that the reliability of the multi-layer printed circuit board can be enhanced. Also, as will be described later, the filler 54 filled in the via holes 47 is flattened by polishing and then the plated covers (conductive layers) 58 covering the filler 54 are arranged and the upper via holes 66 are formed thereon. Due to this, the surfaces of the lower via holes 46 have high flatness and reliability in the connection between the lower via holes 46 and the upper via holes 66 is excellent.

Moreover, as will be described later, in case of the multi-layer printed circuit board in the first embodiment, a de-smear process for penetrating holes 35 which become the through holes 36 and a roughing process for the surface of the lower interlayer resin insulating layer 40 are performed simultaneously using an oxidizer, so that the number of manufacturing steps can be reduced and the multi-layer printed circuit board can be manufactured at low cost.

Next, description will be given to a method of manufacturing the multi-layer printed circuit board with reference to FIGS. 1 to 5.

(1) A copper-clad laminated plate 30A having copper foils 32 each having a thickness of 18 µm and laminated on both sides of a substrate 30 having a thickness of 0.8 mm and made of a glass epoxy resin, FR4, FR5 or BT (Bismaleimide-Triazine) resin, is employed as a starting material (FIG. 1(A)). First, this copper-clad laminated plate is etched in a pattern fashion, thereby forming inner-layer copper patterns 34 on the both sides of the substrate (FIG. 1(B)).

(2) After washing the substrate 30 on which the inner-layer copper patterns 34 are formed, an etching solution containing a cupric complex and an organic acid is reacted under oxygen coexisting conditions such as spraying or bubbling. The copper conductor of a conductor circuit is dissolved to form voids. Through these processes, a rough layer 38 is provided on the surface of each inner-layer copper pattern 34 (FIG. 1(c)).

Alternatively, the rough layer may be provided by an oxidization-reduction process or by employing an electroless plated alloy. The rough layer thus formed has desirably a thickness in a range of 0.1 to 5 µm. In such a range, the separation between the conductor circuit and the interlayer resin insulating layer less occurs.

The cupric complex is preferably a cupric complex of azoles. The cupric complex of azoles functions as an oxidizer for oxidizing metallic copper or the like. Azoles preferably involve diazole, triazole and tetrazole. Particularly, imidazole, 2-methylimidazole, 2-ethylimidazole, 2-ethyl-4-methylimidazole, 2-phenylimidazole, 2-undecylimidazole and the like are preferable. The quantity of added cupric complex of azoles is preferably 1 to 15 wt %. This is because the cupric complex of such a quantity is excellent in solubility and stability.

Further, to dissolve the copper oxide, an organic acid is mixed with the cupric complex of azoles. To be specific, the organic acid is preferably at least one selected from a group consisting of formic acid, acetic acid, propionic acid, butyric acid, valeric acid, caproic acid, acrylic acid, crotonic acid, oxalic acid, malonic acid, succinic acid, glutaric acid, maleic acid, benzoic acid, glycolic acid, lactic acid, malic acid and sulfamic acid. An organic acid content is preferably 0.1 to 30 wt %. With this content, it is possible to maintain the solubility of the oxidized copper and to secure stabile solubility.

The generated cuprous complex is dissolved by the acid, combined with oxygen into a cupric complex which contributes again to the oxidization of copper.

Furthermore, to assist in dissolving copper and oxidizing azoles, halogen ions, such as fluorine ions, chlorine ions and bromine ions, may be added to the etching solution. The present invention can supply halogen ions by adding hydrochloric acid, sodium chloride or the like. The quantity of halogen ions is preferably 0.01 to 20 wt %. Halogen ions of such a quantity ensures excellent adhesiveness between the generated rough surface and the interlayer resin insulating layer.

The cupric complex of azoles and the organic acid (or halogen ions according to necessity) are dissolved in water to thereby adjust the etching solution. Further, a commercially available etching solution, e.g., product name "MEC etch BOND" manufactured by Mec Co., Ltd., can be employed to form a rough surface according to the present invention.

(3) A resin film 50α which becomes a lower interlayer resin insulating layer is bonded on each surface of the substrate 30 by vacuum crimp lamination at a pressure of 5 kgf/cm² while raising temperature to 50 to 150° C. (FIG. 1(D)).

The resin film contains refractory resin, soluble particles, a curing agent and other components. The materials will now be described.

The resin film for use in the resin insulating layer in the manufacturing method according to the present invention has a structure that particles soluble in acid or an oxidizer (hereinafter called "soluble particles") are dispersed in resin which is refractory with respect to acid or an oxidizer (hereinafter called "refractory resin").

The expressions "refractory" and "soluble" will now be described. When materials are immersed in solution composed of the same acid or the same oxidizers for the same time, a material of a type which is dissolved at a relatively high dissolving rate is called a "soluble" material for convenience. A material of a type which is dissolved at a relatively slow dissolving rate is called a "refractory material" for convenience.

The soluble particles are exemplified by resin particles which are soluble in acid or an oxidizer (hereinafter called "soluble resin particles"), inorganic particles which are soluble in acid or an oxidizer (hereinafter called "inorganic soluble particles") and metal particles which are soluble in acid or an oxidizer (hereinafter called "soluble metal particles"). The foregoing soluble particles may be employed solely or two or more particles may be employed.

The shape of each of the soluble particles is not limited. The shape may be a spherical shape or a pulverized shape. It is preferable that the particles have a uniform shape. The reason for this lies in that a rough surface having uniformly rough pits and projections can be formed.

It is preferable that the mean particle size of the soluble particles is 0.1 µm to 10 µm. When the particles have the diameters satisfying the foregoing range, particles having two or more particle sizes may be employed. That is, soluble particles having a mean particle size of 0.1 µm to 0.5 µm and soluble particles having a mean particle size of 1 µm to 3 µmm may be mixed. Thus, a more complicated rough surface can be formed. Moreover, the adhesiveness with the conductor circuit can be improved. In the present invention, the particle size of the soluble particles is the length of a longest portion of each of the soluble particles.

The soluble resin particles may be particles constituted by thermosetting resin or thermoplastic resin. When the particles are immersed in solution composed of acid or an oxidizer, the particles must exhibit dissolving rate higher than that of the foregoing refractory resin.

Specifically, the soluble resin particles are exemplified by particles constituted by epoxy resin, phenol resin, polyimide resin, polyphenylene resin, polyolefin resin or fluorine resin. The foregoing material may be employed solely or two or more materials may be mixed.

The soluble resin particles may be resin particles constituted by rubber. Rubber above is exemplified by polybutadiene rubber, a variety of denatured polybutadiene rubber, such as denatured epoxy rubber, denatured urethane rubber or denatured (metha) acrylonitrile rubber, and (metha) acrylonitrile butadiene rubber containing a carboxylic group. When the foregoing rubber material is employed, the soluble resin particles can easily be dissolved in acid or an oxidizer. That is, when the soluble resin particles are dissolved with acid, dissolution is permitted with acid except for strong acid. When the soluble resin particles are dissolved, dissolution is permitted with permanganate which has a relatively weak oxidizing power. When chromic acid is employed, dissolution is permitted even at a low concentration. Therefore, retention of the acid or the oxidizer on the surface of the resin can be prevented. When a catalyst, such as palladium chloride, is supplied after the rough surface has been formed as described later, inhibition of supply of the catalyst and oxidation of the catalyst can be prevented.

The inorganic soluble particles are exemplified by particles made of at least a material selected from a group consisting of an aluminum compound, a calcium compound, a potassium compound, a magnesium compound and a silicon compound.

The aluminum compound is exemplified by alumina and aluminum hydroxide. The calcium compound is exemplified by calcium carbonate and calcium hydroxide. The potassium compound is exemplified by potassium carbonate. The magnesium compound is exemplified by magnesia, dolomite and basic magnesium carbonate. The silicon compound is exemplified by silica and zeolite. The foregoing material may be employed solely or two or more materials may be mixed.

The soluble metal particles are exemplified by particles constituted by at least one material selected from a group consisting of copper, nickel, iron, zinc, lead, gold, silver, aluminum, magnesium, potassium and silicon. The soluble metal particles may have surfaces coated with resin or the like in order to maintain an insulating characteristic.

When two or more types of the soluble particles are mixed, it is preferable that the combination of the two types of soluble particles is combination of resin particles and inorganic particles. Since each of the particles has low conductivity, an insulating characteristic with the resin film can be maintained. Moreover, the thermal expansion can easily be adjusted with the refractory resin. Thus, occurrence of a crack of the interlayer resin insulating layer constituted by the resin film can be prevented. Thus, separation between the interlayer resin insulating layer and the conductor circuit can be prevented.

The refractory resin is not limited when the resin is able to maintain the shape of the rough surface when the rough surface is formed on the interlayer resin insulating layer by using acid or oxidizer. The refractory resin is exemplified by thermosetting resin, thermoplastic resin and their composite material. As an alternative to this, the foregoing photosensitive resin of a type having photosensitive characteristic imparted thereto may be employed. When the photosensitive resin is employed, exposure and development processes of the interlayer resin insulating layers can be performed to form the openings for the via holes.

In particular, it is preferable that the resin containing thermosetting resin is employed. In the foregoing case, the shape of the rough surface can be maintained against plating solution and when a variety of heating processes are performed.

The refractory resin is exemplified by epoxy resin, phenol resin, phenoxy resin, polyimide resin, polyphenylene resin, polyolefin resin and fluorine resin. The foregoing material may be employed solely or two or more types of the materials may be mixed.

It is preferable that epoxy resin having two or more epoxy groups in one molecule thereof is employed. The reason for this lies in that the foregoing rough surface can be formed. Moreover, excellent heat resistance and the like can be obtained. Thus, concentration of stress onto the metal layer can be prevented even under a heat cycle condition. Thus, occurrence of separation of the metal layer can be prevented.

The epoxy resin is exemplified by cresol novolac epoxy resin, bisphenol-A epoxy resin, bisphenol-F epoxy resin, phenol novolac epoxy resin, alkylphenol novolac epoxy resin, biphenol-F epoxy resin, naphthalene epoxy resin, dicyclopentadiene epoxy resin, an epoxy material constituted by a condensation material of phenol and an aromatic aldehyde having a phenol hydroxyl group, triglycidyl isocyanurate and alicyclic epoxy resin. The foregoing material may be employed solely or two or more material may be mixed. Thus, excellent heat resistance can be realized.

It is preferable that the soluble particles in the resin film according to the present invention are substantially uniformly dispersed in the refractory resin. The reason for this lies in that a rough surface having uniform pits and projections can be formed. When via holes and through holes are formed in the resin film, adhesiveness with the metal layer of the conductor circuit can be maintained. As an alternative to this, a resin film containing soluble particles in only the surface on which the rough surface is formed may be employed. Thus, the portions of the resin film except for the surface is not exposed to acid or the oxidizer. Therefore, the insulating characteristic between conductor circuits through the interlayer resin insulating layer can reliably be maintained.

It is preferable that the amount of the soluble particles which are dispersed in the refractory resin is 3 wt % to 40 wt % with respect to the resin film. When the amount of mixture of the soluble particles is lower than 3 wt %, the rough surface having required pits and projections cannot be formed. When the amount is higher than 40 wt %, deep portions of the resin film are undesirably dissolved when the soluble particles are dissolved by using acid or the oxidizer. Thus, the insulating characteristic between the conductor circuits through the interlayer resin insulating layer constituted by the resin film cannot be maintained. Thus, short circuit is sometimes is caused to occur.

It is preferable that the resin film contains a curing agent and other components as well as the refractory resin.

The curing agent is exemplified by an imidazole curing agent, an amine curing agent, a guanidine curing agent, an epoxy adduct of each of the foregoing curing agents, a microcapsule of each of the foregoing curing agents and an organic phosphine compound, such as triphenylphosphine or tetraphenyl phosphonium tetraphenyl borate.

It is preferable that the content of the curing agent is 0.05 wt % to 10 wt % with respect to the resin film. When the content is lower than 0.05 wt %, the resin film cannot sufficiently be hardened. Thus, introduction of acid and the oxidizer into the resin film occurs greatly. In the foregoing case, the insulating characteristic of the resin film sometimes deteriorates. When the content is higher than 10 wt %, an excessively large quantity of the curing agent component sometimes denatures the composition of the resin. In the foregoing case, the reliability sometimes deteriorates.

The other components are exemplified by an inorganic compound which does not exert an influence on the formation of the rough surface and a filler constituted by resin. The inorganic compound is exemplified by silica, alumina and dolomite. The resin is exemplified by polyimide resin, polyacrylic resin, polyamideimide resin, polyphenylene resin, melanine resin and olefin resin. When any one of the foregoing fillers is contained, conformity of the thermal expansion coefficients can be established. Moreover, heat resistance and chemical resistance can be improved. As a result, the performance of the printed circuit board can be improved.

The resin film may contain solvent. The solvent is exemplified by ketone, such as acetone, methylethylketone or cyclohexane; aromatic hydrocarbon, such as ethyl acetate, butyl acetate, cellosolve acetate, toluene or xylene. The foregoing material may be employed solely or two or more materials may be mixed.

(4) Next, penetrating holes 35 each having a diameter of 300 μm are formed in the core substrate 30 to which the resin films 50 α have been bonded, for forming through holes (FIG. 1(E)).

(5) Via hole openings 52 each having a diameter of 80 μm are formed in the resin films 50α by applying carbonic acid, excimer, YAG or UV laser (FIG. 2(A)). Thereafter, the resin films 50α are thermally hardened to thereby form lower interlayer resin insulating layers 50. The via holes may be formed by an area process using laser or an area process using laser with masks mounted. Alternatively, mixture laser (which means a mixture of, for example, carbonic acid laser and excimer laser) may be employed. Alternatively, both the through holes and the via holes may be formed by using laser.

(6) Next, an oxidizer consisting of a chromic acid or a permanganate (e.g., potassium permanganate or sodium permanganate) is used to subject the penetrating holes 35 for forming through holes formed in the core substrate 30 and the lower interlayer resin insulating layers 50 to a de-smear process and, at the same time, the surfaces of the lower interlayer resin insulating layers 50 are roughened (FIG. 2(B)). While temperature for performing these processes is set at 65° C. wherein, the processes may be performed at temperature which fall within a range of 40 to 70° C.

The rough surfaces of the interlayer resin insulating layers are formed to have a thickness in a range of 0.5 to 5 mm. The thickness in that range can ensure adhesiveness and the interlayer resin insulating layers can be removed in a later step.

The multi-layer printed circuit board in the first embodiment has the core substrate 30 consisting of one of an FR4 resin, an FR5 resin or a BT resin and has the lower interlayer resin insulating layers 50 containing at least one of an epoxy resin, a phenol resin, a polyimide resin, a polyphenylene resin, a polyolefin resin, a fluorocarbon resin. It is, therefore, possible to simultaneously perform the de-smear process using an oxidizer consisting of a chromic acid and a permanganate to the through holes 35 and the roughing process to the lower interlayer resin insulating layers 50. Thus, the number of steps is reduced to thereby manufacture the multi-layer printed circuit board at low cost. An electroless plated film is formed to have a thickness in a range of 0.1 to 5 μm. If having a thickness in that range, the electroless plated film can be formed entirely and easily etched away.

(7) A palladium catalyst is applied to the roughed surfaces of the interlayer resin insulating layers 50 to form electroless copper plated films 42 in an electroless plating solution (FIG. 2(C)). While the electroless copper plated films are formed herein, copper or nickel coats may be formed by sputtering. Alternatively, the surface layers may be subjected to a plasma, UV or corona process as a drying process. Through the process, the surfaces of the layers 50 are reformed.

(8) After washing the substrate on which the electroless copper plated films 42 have been formed, plating resists 43 each having a predetermined pattern are formed (FIG. 2(D)).

(9) The substrate is immersed in an electroplating solution to supply an electric current thereto through the electroless copper plated films 42, thereby forming electroplated copper films 44 (FIG. 2(E)).

(10) The plating resists 43 are separated and removed with KOH and the electroless copper plated films 42 under the plating resists are etched away by light etching, thereby forming via holes 46 and through holes 36 each consisting of the electroless copper plated film 42 and the electroplated copper film 44 (FIG. 3(A)).

(11) A rough layer (made of an alloy consisting of Cu—Ni—P) 47 is formed in each of the via holes 46 and the through holes 36 by electroless plating (FIG. 3(B)). Instead of electroless copper plating, the rough layer can be formed by etching (e.g., etching by spraying or immersing the holes by or into a solution of a mixture of a cupric complex and an organic acid salt) or by an oxidization-reduction process.

(12) Resin filler 54 is prepared to have a viscosity of 50 Pa·S at 23° C., masks having openings according to the diameters of the through holes 36 and the via holes 46, respectively, are mounted, the resin filler 54 is filled by printing and dried in a drying furnace at a temperature of 100° C. for 20 minutes (FIG. 3(C)). In the first embodiment, the same filler is simultaneously filled in the through holes 36 and the via holes 46, so that the number of manufacturing steps can be reduced.

Here, as the resin filler, the following material compositions can be employed:

[Resin Composition]

100 parts by weight of bisphenol F epoxy monomer (YL983U having a molecular weight of 310 and manufactured by Yuka Shell), 72 parts by weight of $SiO_2$ spherical particles having a surface coated with a silane coupling agent and having a mean particle diameter of 1.6 μm (CRS 101-1-CE manufactured by Admatec, where the maximum particle size is not larger than the thickness (15 μm) of an inner-layer copper pattern to be described later), 6.5 parts by weight of an imidazole curing agent (2E4MZ-CN manufactured by Shikoku Chemicals) and 1.5 parts by weight of a leveling agent (PERENOL S4 manufactured by SANNOPCO) are stirred and mixed to thereby adjust the viscosity of the resultant mixture to 36,000 to 49,000 cps at 23±1° C.

(13) One side of the substrate 30 for which the process of (12) has been completed, is polished so as to flatten the surface of the resin filler 54 protruding from the openings of the via holes 46 and the through holes 36. Then, buffing is conducted once or a plurality of times to remove flaws caused by polishing. The series of polishing processes are also conducted to the other side of the substrate (FIG. 3(D)).

It is noted that the protruded resin filler can be removed and flattened only by buffing.

The advantage of conducting buffing is that various types of particles are contained in the interlayer resin insulating layers and are not scraped away during polishing.

Next, the resin filler 54 is hardened by conducting a heat process at 100° C. for one hour and at 150° C. for one hour.

Thus, a resin filler layer having the hardened resin filler containing the epoxy resin, the curing agent and the inorganic particles, is formed in each through hole.

While the epoxy resin is not limited to a particular resin, it is preferably at least one selected from a group consisting of bisphenol epoxy resins and novolac resins. This is because if a bisphenol A or F epoxy resin is selected, the viscosity of the resultant mixture can be adjusted without using a dilution solvent. In addition, novolac epoxy resins are excellent in strength, heat resistance and chemical resistance, are not decomposed even in a strong base solution such as electroless plating solution and are not thermally decomposed.

As the bisphenol epoxy resin, a bisphenol A epoxy resin or a bisphenol F epoxy resin is preferable. The bisphenol F epoxy resin is more preferable because it can be employed with a low viscosity and without using a solvent.

Further, as the novolac epoxy resin, at least one selected from phenol novolac epoxy resins and cresol novolac epoxy resins is preferable.

Alternatively, a mixture of a bisphenol epoxy resin and a novolac epoxy resin may be employed.

In the latter case, a mixture ratio of, for example, the bisphenol epoxy resin to the cresol novolac epoxy resin is preferably 1/1 to 1/100. By mixing the bisphenol epoxy resin and the cresol novolac epoxy resin with each other in that range, it is possible to suppress the viscosity of the resultant mixture from rising.

The curing agent contained in the resin filler is not limited to a particular one and a well-known curing agent is available; however, an imidazole curing agent or an amine curing agent is preferable. If such a curing agent is employed, the contraction degree of the filler when the filler is hardened is small and the adhesiveness between the conductor layer constituting the through holes and the resin filler layer is particularly excellent.

Further, the inorganic particles contained in the resin filler may consist of, for example, aluminum compounds, calcium compounds, potassium compounds, magnesium compounds, silicon compounds and the like. They may be used solely or two or more of them may be employed.

The aluminum compounds involve, for example, alumina, aluminum hydroxide and the like. The calcium compounds involve, for example, calcium carbonate, calcium hydroxide and the like. The magnesium compounds involve, for example, magnesia, dolomite, basic magnesium carbonate, talc and the like. The silicon compounds involve, for example, silica, zeolite and the like.

The resin filler contains inorganic particles of 10 to 50 wt %. The inorganic particle content in that range allows matching thermal expansion coefficients between the interlayer resin insulating layers. It is more preferable that the resin filler contains inorganic particles of 20 to 40 wt %.

The shapes of the inorganic particles involve spherical, circular, ellipsoidal, pulverized, polygonal shapes. Among them, the spherical, circular and ellipsoidal shapes are more preferable. This is because these shapes can suppress the occurrence of cracks and the like resulting from particle shapes. Further, the particles may be coated with a silica coupling agent. By doing so, the adhesiveness between the inorganic particles and the epoxy resin improves.

It is also preferable that a rough surface is formed on at least part of the surface of the conductor layers constituting the through holes. If so, the adhesiveness between the conductor layers and the resin filler layers further improves and expansion and contraction in a heat history can be suppressed to thereby make it more difficult to separate the conductor layers from the resin filler layers. The mean roughness of the rough surface is preferably 0.05 to 5 μm. If the mean roughness is less than 0.05 μm, the effect of roughing the surfaces of the conductor layers is hardly obtained. If the mean roughness exceeds 5 μm, signal delays and signal errors resulting from a skin effect at the time of signal transmission may possibly occur.

The resin filler may contain not only the epoxy resin but also other thermosetting resins, thermoplastic resins, photosensitive resins, complexes thereof or the like.

The thermosetting resins involve, for example, a polyimide resin and a phenol resin. The thermoplastic resins involve, for example, a fluorocarbon resin such as polytetrafluoroethylene (PTFE), tetrafluoroethylene/hexafluoropropylene copolymer (fluorinated ethylene propylene) (FEP) and tetrafluoroethylene/perphloroalkoxy copolymer (PFA), polyethylene terephthalate (PET), polysulfone (PSF), polyphenylene sulfide (PPS), thermoplastic polyphenylene ether (PPE), polyether sulfone (PES), polyetherimide (PEI), polyphenylene sulfone (PPES), polyethylene naphthalate (PEN), poly(ether ether ketone) (PEEK), polyolefin and phenoxy resins. The photosensitive resins involve, for example, acrylic resins by adding a (meta) acrylic acid having photosensitive groups to part of thermosetting resins. There resins may be used solely or two or more resins may be employed. Instead of the epoxy resin, these resins or complexes thereof (i.e., a complex of a thermosetting resin and a thermoplastic resin or a complex of a photosensitive resin and a thermoplastic resin) may be employed.

Further, resin particles, metallic particles and the like other than the inorganic particles may be mixed with the resin filler. The resin particles involve those obtained by sphering thermosetting resins, thermoplastic resins and the like. The metallic particles involve conductive particles such as gold, silver and copper particles and the like. They may be used solely or two types or more particles may be employed. Alternatively, they may be employed instead of the inorganic particles.

The resin filler may contain a solvent such as NMP (N-methylpyrrolidone), DMDG (diethylene glycol dimethyl ether), glycerol, cyclohexanol, cyclohexanone, methyl cellosolve, methyl cellosolve acetate, methanol, ethanol, butanol or propanol, (solvent-impregnated type); however, it is more preferable that the resin filler contains no solvent (non-solvent-containing type). This is because air bubble is less left in the through holes and the like after hardening the resin filler if the resin filler contains no solvent. If air bubble is left, reliability and connection characteristics deteriorate.

(14) A palladium catalyst is applied to the surfaces of the interlayer resin insulating layers 50 to thereby form electroless copper plated films 56 in an electroless plating solution (FIG. 4(A)). While the electroless copper plated films are formed herein, copper or nickel coats can be formed by sputtering. In some cases, electroplating can be directly performed to the interlayer resin insulating layers 50.

(15) After forming plating resists (not shown) each having a predetermined pattern, electroplated copper films 57 are formed. Then, the plating resists are separated and removed and the electroless copper plated films 56 under the plating resist are separated by light etching, thereby forming plated covers 58 each consisting of the electroless copper plated film 56 and the electroplated copper film 57 in the opening portions of the via holes 46 and the through holes 36, respectively (FIG. 4(B)).

(16) Rough layers (Cu—Ni—P) are formed on the plated covers 58 provided on the openings of the via holes 46 and the through holes 36 by electroless plating, respectively (FIG. 4(C)). The rough layers can be formed by etching or an oxidization-reduction process instead of the electroless copper plating.

(17) By repeating the steps (3) to (11) described above, upper interlayer resin insulating layers 60 are formed and via holes 66 each consisting of the electroless copper plated film 62 and the electroplated copper film 64 on the upper interlayer resin insulating layers 60 (FIG. 4(D)).

(18) Next, solder resists and solder bumps are formed. The material composition of the solder resist is as follows.

46.67 g of oligomer (having a molecular weight of 4000) which is obtained by forming 50% of epoxy groups of 60 wt % cresol novolac epoxy resin (manufactured by Nippon Kayaku) dissolved in DMDG into an acrylic structure and which imparts photosensitive characteristic, 15.0 g of 80 wt % bisphenol A epoxy resin (Epicoat 1001 manufactured by Yuka Shell) dissolved in methyl ketone, 1.6 g of an imidazole curing agent (2E4MZ-CN manufactured by Shikoku Chemicals), 3 g of polyhydric acrylic monomer which is photosensitive monomer (R604 manufactured by Nippon Kayaku), 1.5 g of polyhydric acrylic monomer (DPE6A manufactured by Kyoei Chemical) and 0.71 g of a dispersing deforming agent (S-65 manufactured by SANNOPCO) are mixed with one another. Then, 2 g of benzophenone (manufactured by Kanto Chemical) serving as a photoinitiator and 0.2 g of Michler's ketone (manufactured by Kanto Chemical) serving as a photosensitizer are added to the resultant mixture, thereby obtaining a solder resist composition having a viscosity adjusted to 2.0 Pa·s at 25° C.

For the solder resist layers, various types of resins may be used. For example, a resin obtained by hardening a bisphenol A epoxy resin, a bisphenol A epoxy acrylate resin, a novolac epoxy resin or a novolac epoxy acrylate resin by an amine curing agent, an imidazole curing agent or the like can be used.

In case of forming a solder bump by providing an opening in the solder resist layer, in particular, it is preferable to use a resin containing "a novolac epoxy resin or a novolac epoxy acrylate resin" and containing "an imidazole curing agent" as a curing agent.

The above solder resist composition 70α is applied to each side of the multi-layer printed circuit board obtained in the step (17) to have a thickness of 40 μm (FIG. 5(A)).

(19) Then, a drying process is performed at 70° C. for 20 minutes and at 80° C. for 30 minutes. Thereafter, a photomask film which has a thickness of 5 mm and on which a circular pattern (mask pattern) drawn is made hermetic contact with the both sides of the resultant multi-layer printed circuit board, mounted thereon, exposed with ultraviolet rays with 1000 mj/cm$^2$ and subjected to a DMTG development process. Further, a heat process is performed on conditions of 80° C. for one hour, 100° C. for one hour, 120° C. for one hour and 150° C. for three hours, to thereby form solder resist layers 70 (a thickness of 20 μm) each having opening portions 71 (an opening diameter of 200 μm) (FIG. 5(B)).

(20) Thereafter, the multi-layer printed circuit board is immersed in an electroless nickel plating solution composed of 2.3×10$^{-1}$ mol/l sodium hypophosphite and 1.6×10$^{-1}$ mol/l sodium citrate and having pH=4.5 for 20 minutes. Thus, a nickel plated layer 72 having a thickness of 5 μm is formed in each opening portion 71. Then, the multi-layer printed circuit board is immersed in an electroless gold plating solution composed of 7.6×10$^{-3}$ mol/l gold potassium cyanide, 1.9×10$^1$ mol/l ammonia chloride, 1.2×10$^{-1}$ mol/l sodium citrate and 1.7×10$^{-1}$ mol/l sodium hypophosphite on conditions of 80° C. for 7.5 minutes. Thus, gold plated layers 74 each having a thickness of 0.03 μm are formed on the nickel plated layers 72, respectively (FIG. 5(C)).

In the above-stated case, the intermediate layer is formed out of nickel and the noble metal layer out of gold. Alternatively, the intermediate layer may be formed out of palladium, tin or titanium instead of nickel and the noble metal layer may be formed out of silver, platinum or the like other than gold. Two or more noble metal layers may be formed. As surface processes, a drying process, a plasma process, a UV process and a corona process may be performed. By doing so, it is possible to enhance the filling efficiency of the under-filler for the IC chip.

(23) Then, a solder paste is printed on each opening 71 of the solder resist layer 70 and a reflow process is conducted to thereby form a solder bump (solder) 76 in each of the upper surface-side via holes 66. Also, a conductive connection pin 78 is attached to each of the lower surface-side via holes 66 through the solder 77 (see FIG. 6). It is also possible to form a BGA instead of the conductive connection pin.

As the solder, Sn/Pb, Sn/Sb, Sn/Ag, Sn/Sb/Pb, Sn/Ag/Cu and the like may be used.

The melting point of the solder is preferably 180 to 280° C. The solder having the melting point in that range can ensure that the conductive connection pin has a strength of 2.0 Kg/pin or higher. If the melting point is lower than that range, the strength of the pin decreases. If exceeding the range, the solder resist layer may possibly be dissolved. It is particularly preferable that the melting point of the solder is 200 to 260° C.

It is more preferable that the melting point of the solder at the conductive connection pin side is higher than that of the solder at the solder bump side. By doing so, conductive connection pins are not inclined or detached during reflow if an IC chip is mounted as a flip chip. A combination of solders is, for example, Sn/Pb at the solder bump side and Sn/Sb at the conductive connection pin side.

COMPARISON EXAMPLE 1

Figure 1:
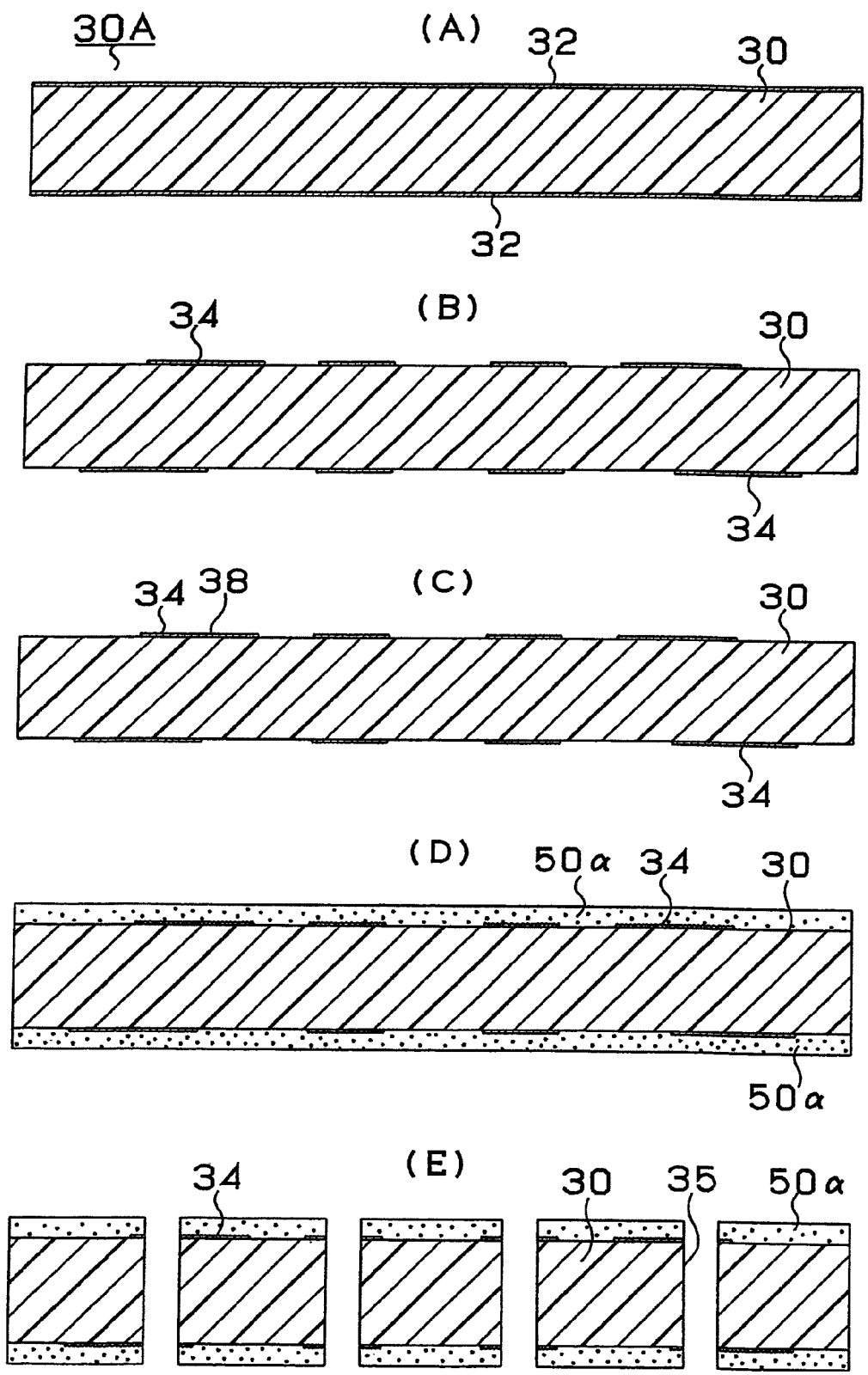
FIG. 1 is a diagram showing a process for manufacturing a multi-layer printed circuit board according to the first embodiment of the present invention.
Figure 2:
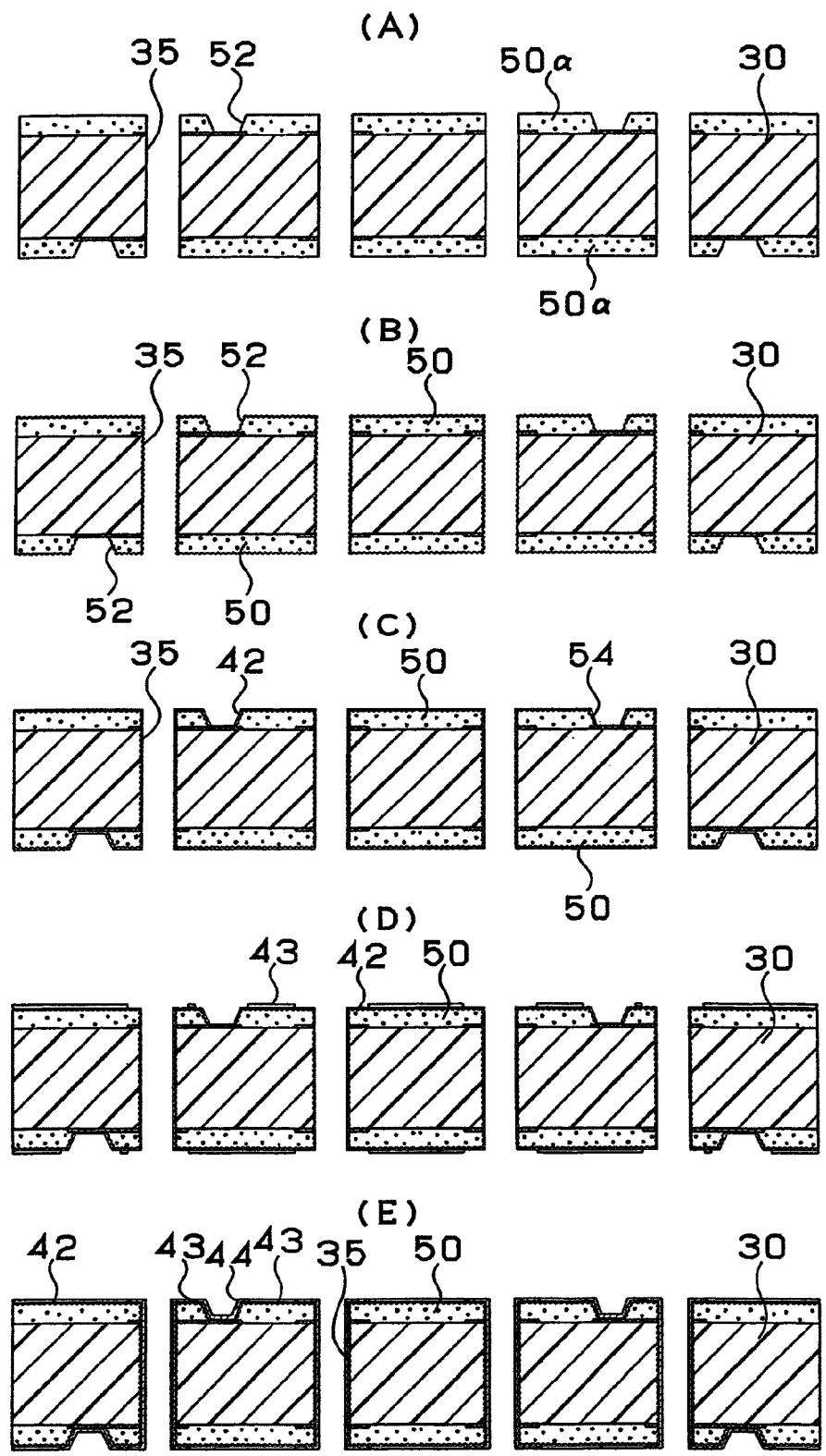
FIG. 2 is a diagram showing a process for manufacturing the multi-layer printed circuit board according to the first embodiment.
Figure 4:
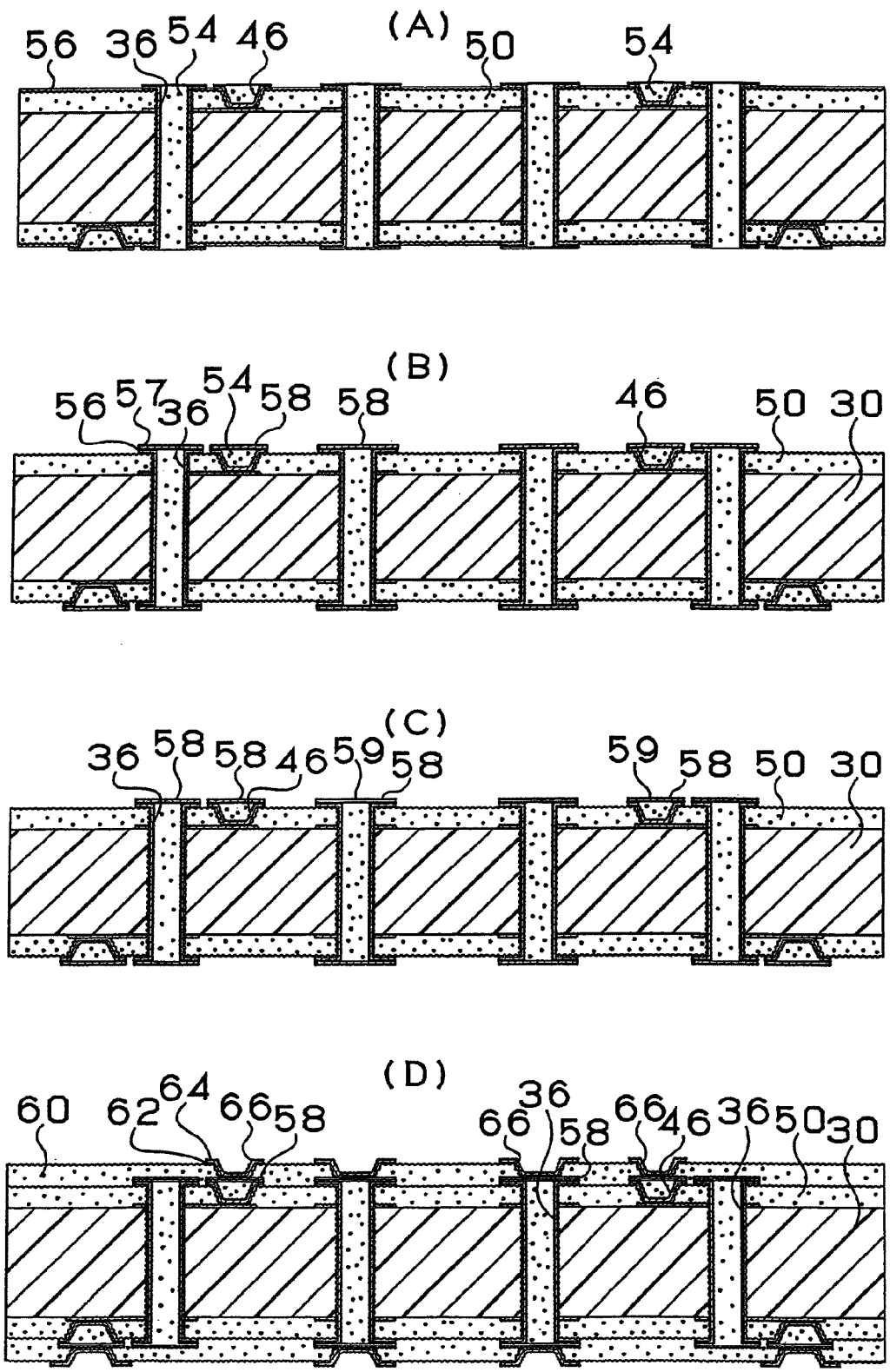
FIG. 4 is a diagram showing a process for manufacturing the multi-layer printed circuit board according to the first embodiment.
Figure 5:
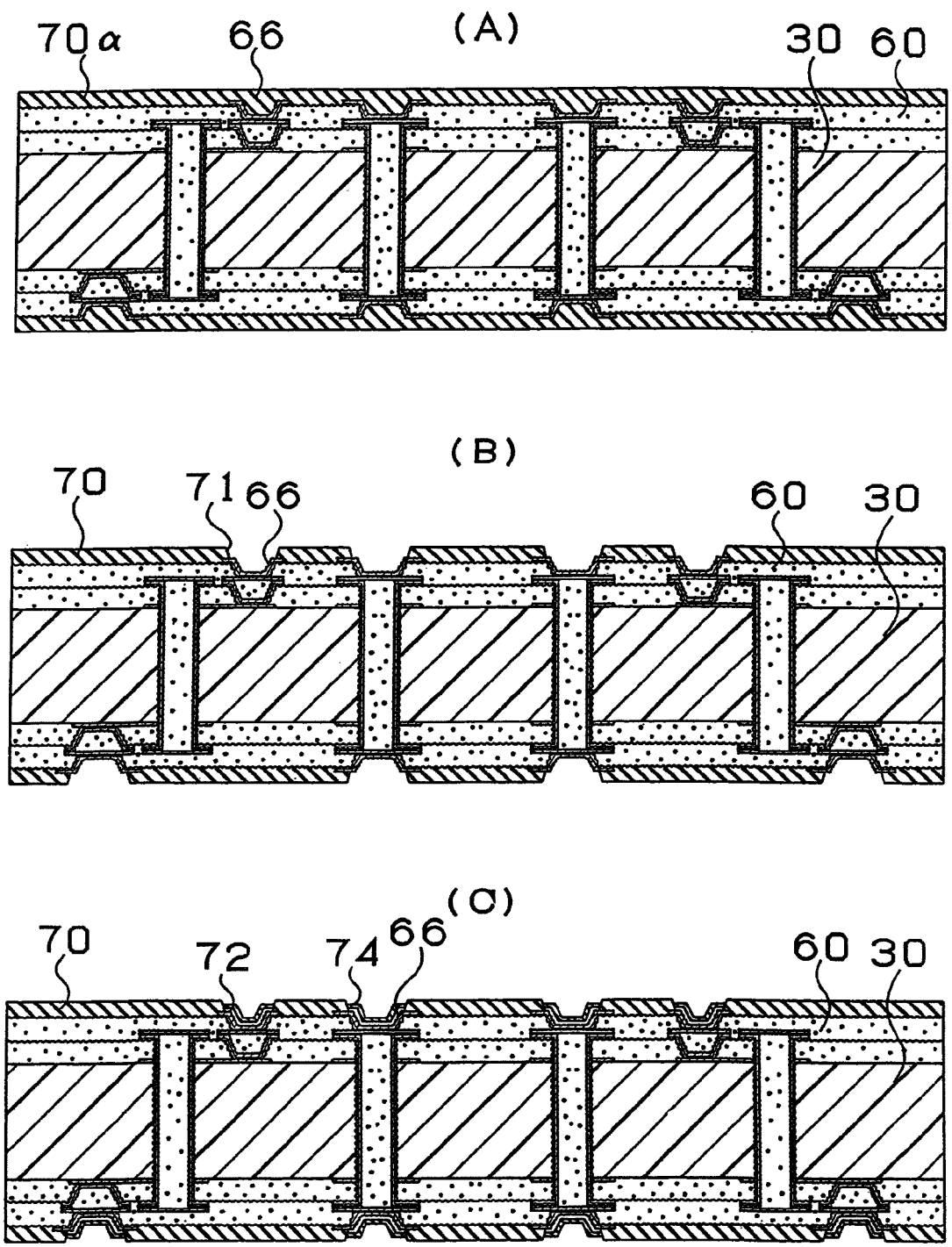
FIG. 5 is a diagram showing a process for manufacturing the multi-layer printed circuit board according to the first embodiment.

As a comparison example 1, a multi-layer printed circuit board was obtained which board is the same in constitution as the multi-layer printed circuit board in the first embodiment shown in FIG. 1 and which has lower via holes filled with copper plated layer. The evaluation results of the multi-layer printed circuit board in the first embodiment and that in the comparison example 1 are shown in FIG. 7.

Electrical connection characteristic was evaluated by inspecting continuity using a checker. If short circuit and disconnection occurred, the multi-layer printed circuit board was judged NG and otherwise, judged OK. The separation and expansion thereof were inspected by cutting the multi-layer printed circuit boards in cross section after a heat cycle test (in which 1000 cycles were repeated with one cycle set as −65° C./3 minutes+130° C./3 minutes) and then visually inspecting the separation and expansion of the interlayer resin insulating layers and the via holes using a microscope (×100 to 400).

In the comparison example 1, dents which were not completely filled with a plated material were formed on the surfaces of the lower via holes and the connection characteristic between the upper and lower via holes deteriorated. Due to this, there were some via holes which were not electrically connected to each other.

Further, after the heat cycle test, it was observed that because of the separation between the via holes, the separation and expansion occurred to the interlayer resin insulating layers. In the multi-layer printed circuit board in the first embodiment, the connection characteristics did not deteriorate and the separation and expansion were not observed.

COMPARISON EXAMPLE 2

As a comparison example 2, a multi-layer printed circuit board was obtained which board is the same in constitution as the multi-layer printed circuit board in the first embodiment shown in FIG. 6 and which has the resin filler used in the first embodiment and filled in through holes and has a metal paste mainly consisting of a silver paste and filled in via holes. In the multi-layer printed circuit board in the comparison example 2, the coefficient of the thermal expansion of the via holes 66 filled with the metal paste greatly differed from that of the through holes 26 filled with the resin filler. Due to this, a force transferred to the lower interlayer resin insulating layers 50 from the lateral direction varies and the interlayer resin insulating layers 50 expanded or separated from a core substrate 30. In the embodiment stated above, by contrast, the separation of the lower interlayer resin insulating layers 50 did not occur.

When a heat cycle test was conducted (in which 1000 cycles were repeated with one cycle set as −65° C./3 minutes+130° C./3 minutes), the connection characteristics and adhesiveness did not deteriorate in the embodiment. In the comparison example 2, because of the difference in filler material, it was observed that the adhesiveness of some parts deteriorated and the separation of the interlayer resin insulating layers occurred.

COMPARISON EXAMPLE 3

A comparison example 3 is almost the same as the first embodiment except that the quantity of mixed silica was 271 parts by weight and that the mixture ratio of inorganic particles to resin filler was 71.5 wt %.

COMPARISON EXAMPLE 4

A comparison example 4 is almost the same as the first embodiment except that the quantity of mixed silica was 5.7 parts by weight and that the mixture ratio of inorganic particles to resin filler was 5.0 wt %.

In the comparison example 3, it was observed that cracks occurred to the resin filler under heat cycle conditions. In the comparison example 4, the surface portion of the resin filler was not polished flat and insufficiently polished portions and recessed portions resulting from the separation of inorganic particles were observed. Further, it was observed that the thicknesses of the plated films on the resin filler were uneven or the plated films were not deposited.

Second Embodiment

The constitution of a printed circuit board according to the second embodiment of the present invention will be described hereinafter with reference to FIG. 13 which is a cross-sectional view of a printed circuit board 110.

The printed circuit board 110 consists of a core substrate 130 and buildup wiring layers 180A and 180B. Each of the build up wiring layers 180A and 180B consists of interlayer resin insulating layers 150 and 160. Via holes 146 and conductor circuits 145 are formed on the interlayer resin insulating layers 150. Via holes 166 and conductor circuits 165 are formed on the interlayer resin insulating layers 160. Solder resist layers 170 are provided on the respective interlayer resin insulating layers 160.

Next, description will be given to a method of manufacturing the printed circuit board according to the second embodiment of the present invention. Here, A. interlayer resin insulating films used for manufacturing the printed circuit board in the second embodiment will be described, while B. resin filler will not be described since the resin filler is the same in material composition as the resin filler used in the first embodiment.

A. Manufacture of a Resin Film for Forming the Interlayer Resin Insulating Layers:

30 parts by weight of a bisphenol A epoxy resin (Epicoat 1001 having an epoxy equivalent of 469 and manufactured by Yuka Shell), 40 parts by weight of a cresol novolac epoxy resin (Epichron N-673 having an epoxy equivalent of 215 and manufactured by Dainippon Ink & Chemicals) and 30 parts by weight of a phenol novolac resin containing triazine structure (Phenolight KA-7052 having a phenol hydroxyl group equivalent of 120 and manufactured by Dainippon Ink & Chemicals) were heated and dissolved in 20 parts by weight of ethyl diglycol acetate and 20 parts by weight of solvent naphtha while being stirred. Then, 15 parts by weight of polybutadiene rubber having epoxy terminal (Denalex R-45EPT manufactured by Nagase Chemicals), 1.5 parts by weight of pulverized 2-phenyl-4,5bis(hydroxymethyl) imidazole, 2 parts by weight of particle-size reduced silica and 0.5 parts by weight of a silicon defoaming agent were added thereto, thus preparing an epoxy resin composition. The obtained epoxy resin composition was applied onto a PET film having a thickness of 38 μm by using a roll coater so that the thickness of the film was 50 μm after the film was dried, and dried at 80 to 120° C. for 10 minutes, thereby manufacturing the resin film for forming an interlayer resin insulating layer.

Figure 13:
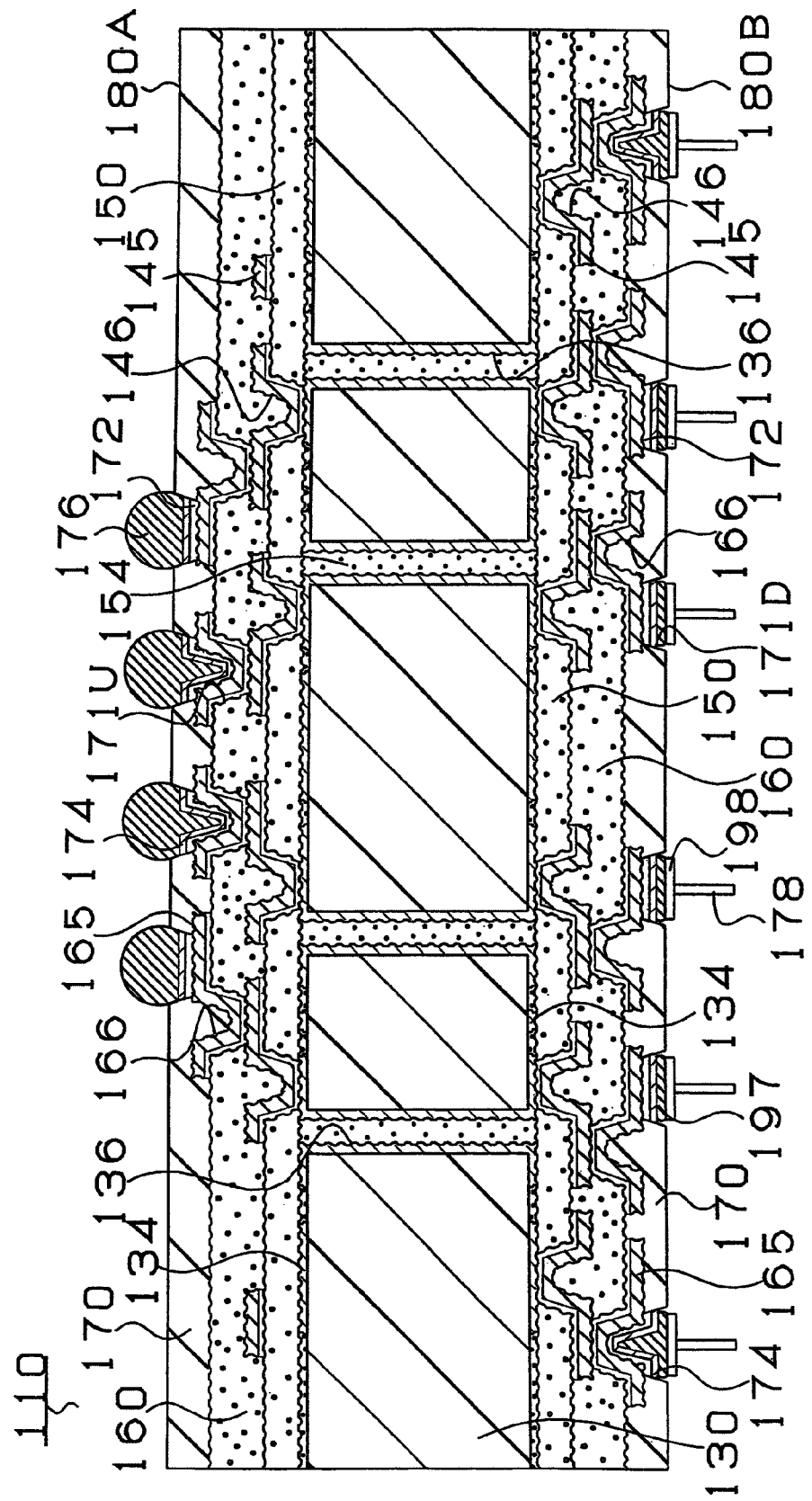
FIG. 13 is a cross-sectional view of the printed circuit board according to the second embodiment.
Figure 14:
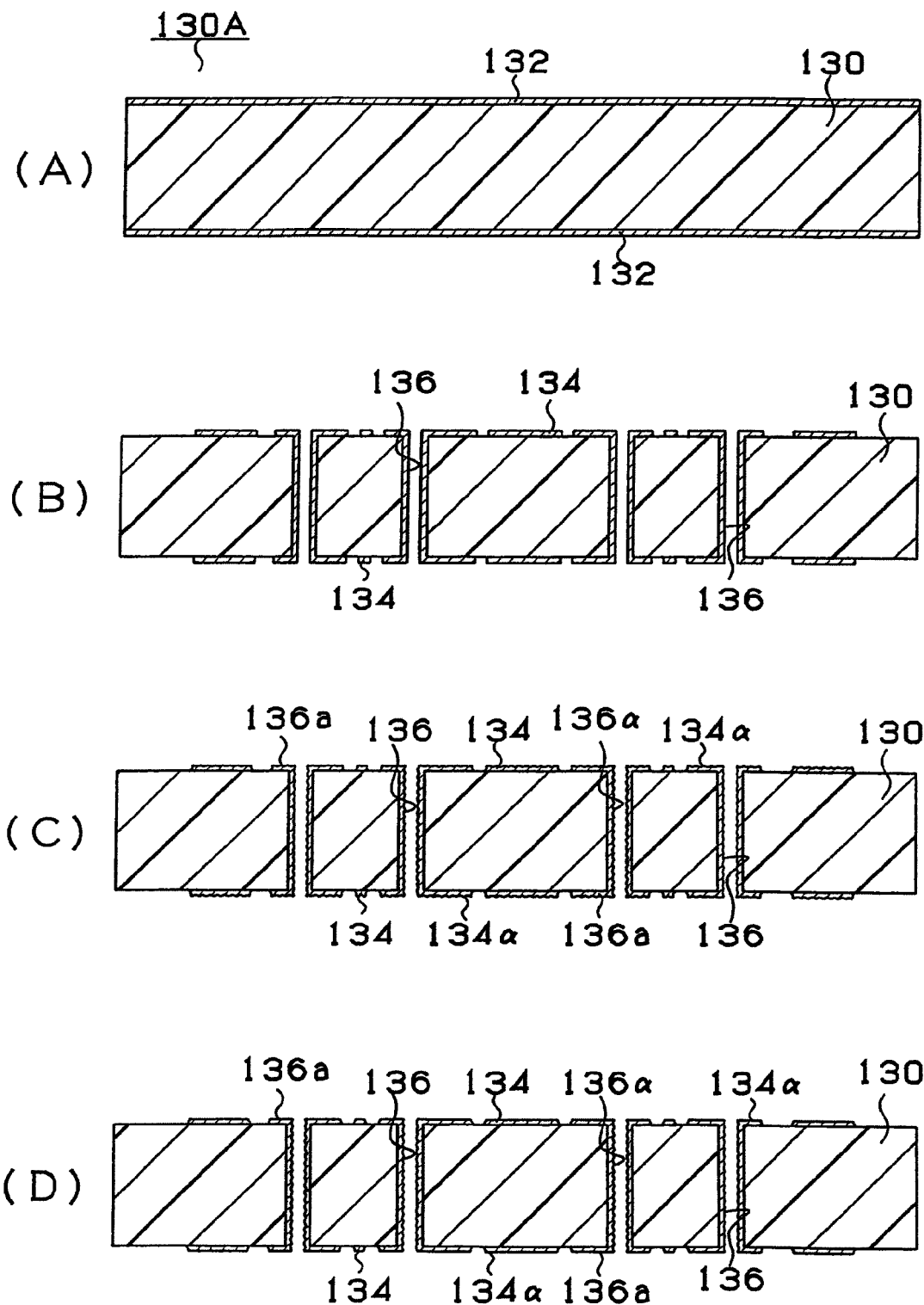
FIG. 14 is a diagram showing a process for manufacturing a multi-layer printed circuit board according to the first modification of the second embodiment.
Figure 15:
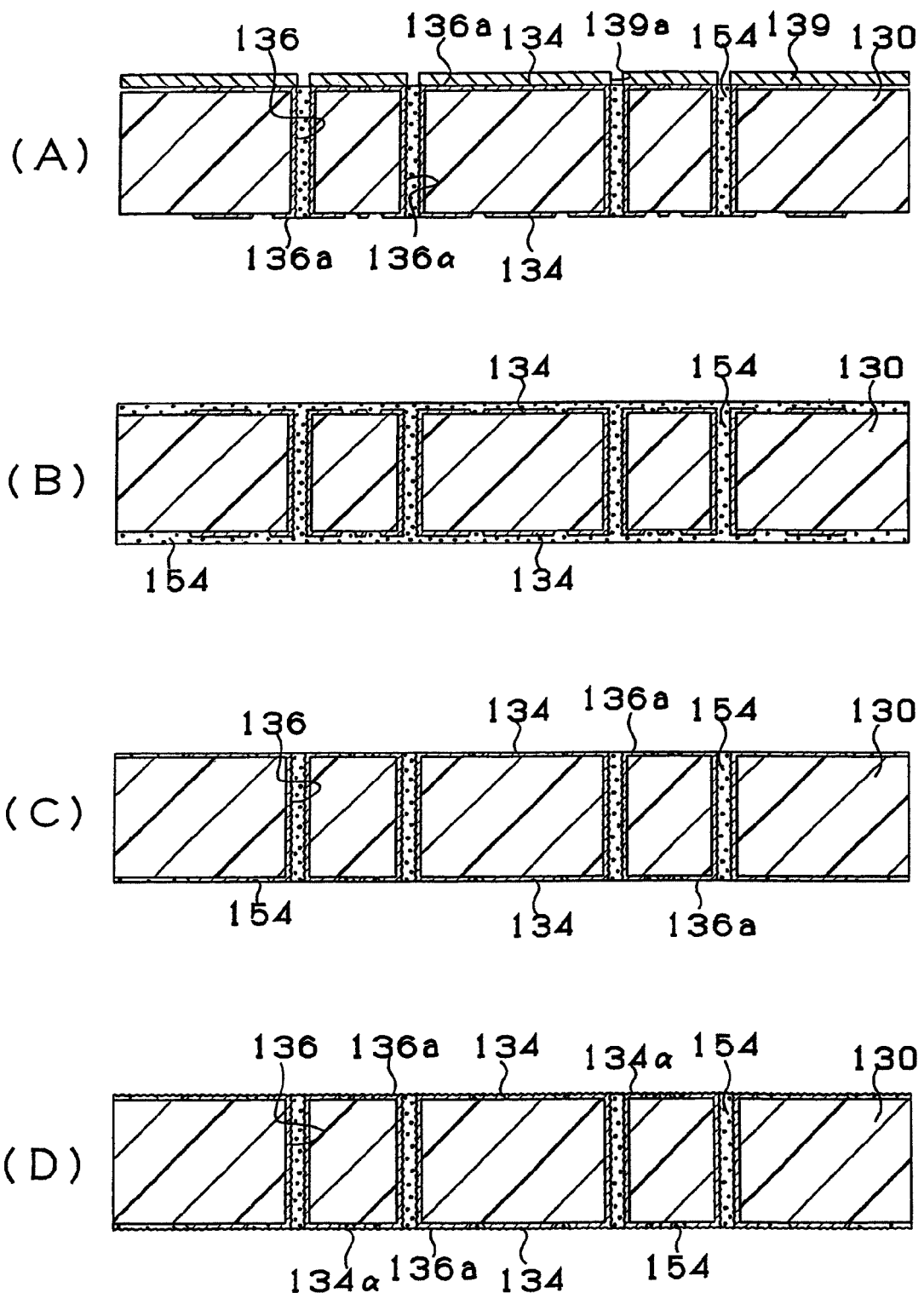
FIG. 15 is a diagram showing a process for manufacturing the multi-layer printed circuit board according to the first modification of the second embodiment.
Figure 16:
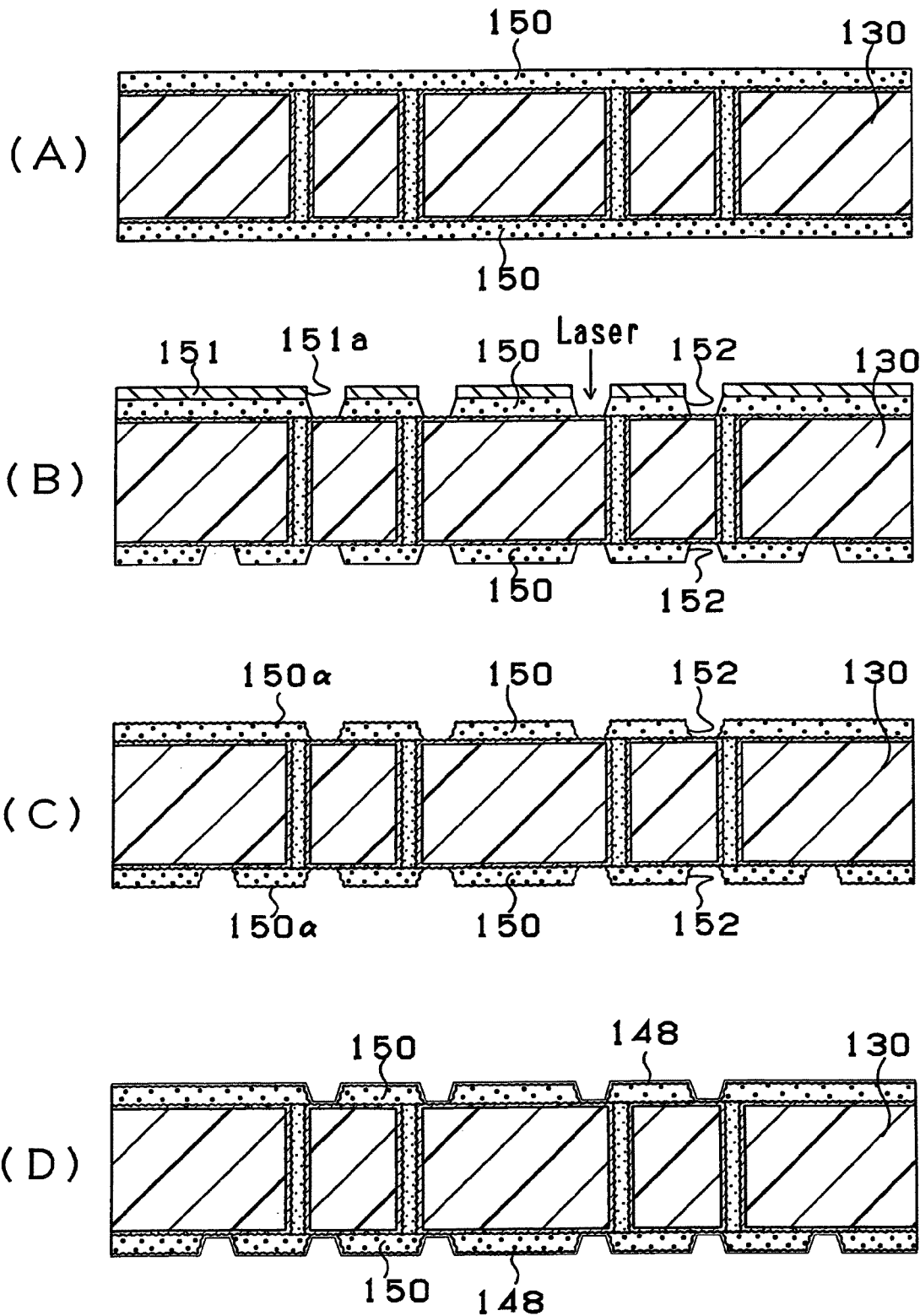
FIG. 16 is a diagram showing a process for manufacturing the multi-layer printed circuit board according to the first modification of the second embodiment.
Figure 17:
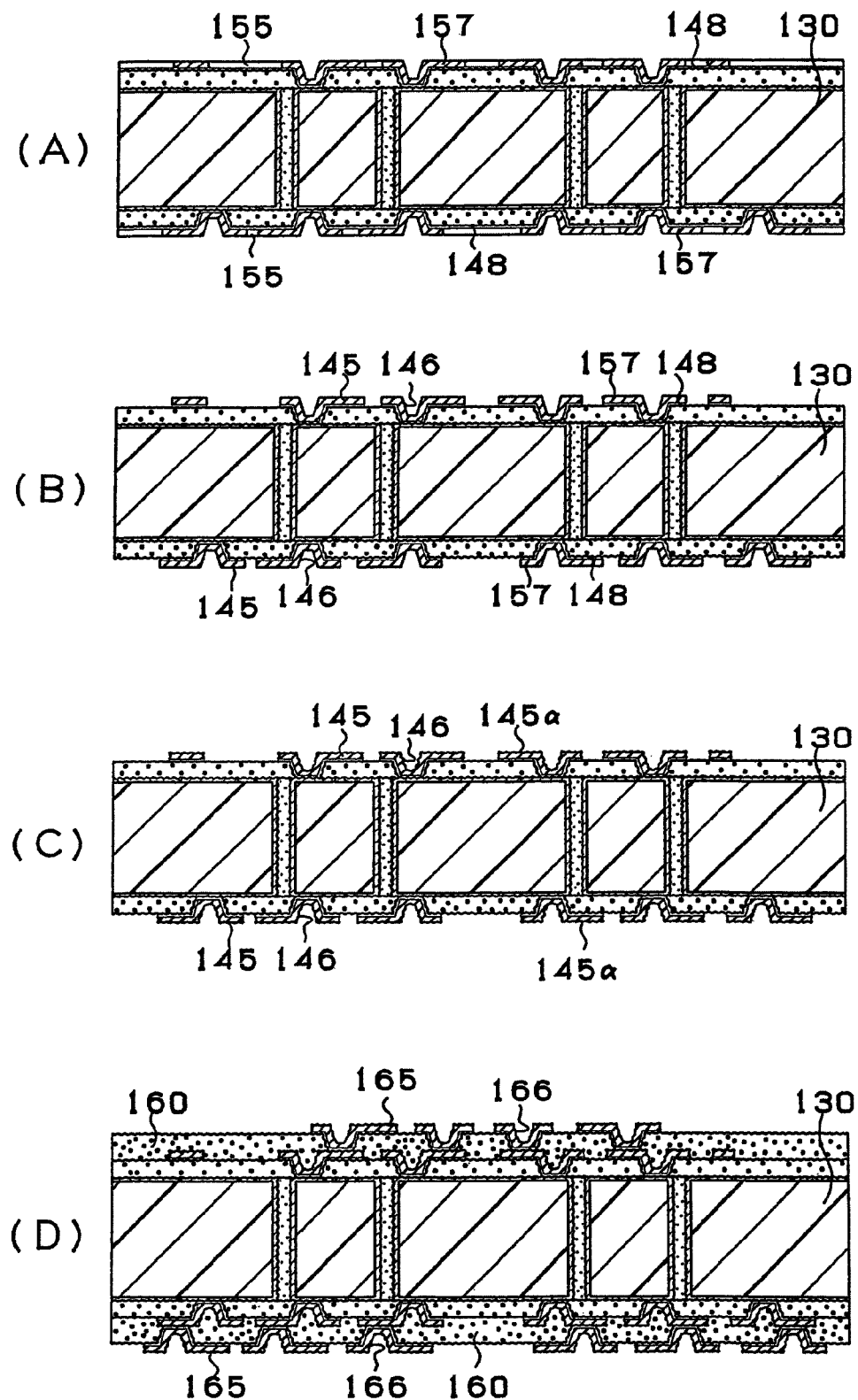
FIG. 17 is a diagram showing a process for manufacturing the multi-layer printed circuit board according to the first modification of the second embodiment.

The description of the method of manufacturing the printed circuit board stated above with reference to FIG. 13 will be continued with reference to FIGS. 8 to 13.

(1) A copper-clad laminated plate 130A having copper foils 132 each having a thickness of 18 μm and laminated on the both sides of a substrate 130 having a thickness of 0.8 mm and made of a glass epoxy resin or a BT (Bismaleimide-Triazine) resin is employed as a starting material (FIG. 8(A)). First, this copper-clad laminated plate 130A is drilled, subjected to an electroless plating process and etched in a pattern fashion, thereby forming lower conductor circuits 134 and through holes 136 on the both sides of the substrate 130 (FIG. 8(B)).

(2) After washing and drying the substrate 130 on which the through holes 136 and the lower conductor circuits 134 have been formed, a blackening process using a solution containing NaOH (10 g/l), NaClO$_2$ (40 g/l) and Na$_3$PO$_4$ (6 g/l) as a blackening bath (oxidization bath) and a reduction process using a solution containing NaOH (10 g/l) and NaBH$_4$ (6 g/l) as a reduction bath are conducted to thereby form rough layers 134α and 136α on the entire surfaces of the lower conductor circuits 134 including the through holes 136 (FIG. 8(C)). The roughing process may be surface roughing or the like by conducting soft etching, by forming a needle-type alloy plated material consisting of copper-nickel-phosphorous (Interplate manufactured by EBARA UDYLITE Co., Ltd.) or by using an etching solution such as "MEC etch BOND" manufactured by Mec Co., Ltd.

(3) Next, the surfaces of the lands 136a of the through holes 136 having the rough layers 136α formed thereon, respectively, are polished by buffing and the rough layers 136α of the lands 136a are separated to flatten the surfaces of the lands 136a (FIG. 8(D)).

(4) The resin filler described in B above is prepared, a mask 139 having opening portions 139a corresponding to the respective through holes 36 is mounted on the substrate 130 within 24 hours of the preparation of the resin filler, and the resin filler 154 is pushed into the through holes 136 using a squeegee and dried on conditions of 100° C. for 20 minutes (FIG. 9(A)). In the step of (3) above, after forming the rough layers 136α on the through holes 136, the surfaces of the lands 136a of the through holes 136 are polished and flattened. Due to this, when filling the resin filler in the through holes 136, it is possible to prevent the resin filler 154 from flowing out along the rough layers (anchors) formed on the lands 136a of the through holes 136. It is, therefore, possible to form the filler 154 in the through holes flat and to enhance the reliability of wirings above the through holes to be formed in a step described later.

Furthermore, the layers of resin filler 154 are formed on portions on which the lower conductor circuits 134 are not formed using a squeegee and dried on conditions of 100° C. for 20 minutes (FIG. 9(B)). As the resin filler 154, it is preferable to employ one selected from a mixture of an epoxy resin and organic filler, a mixture of an epoxy resin and inorganic filler and a mixture of an epoxy resin and inorganic fiber. Alternatively, the resin filler in the first embodiment may be employed.

(5) One side of the substrate 130 for which the process described in (4) above has been completed, is polished by belt sander polishing using #600 belt abrasive paper (manufactured by Sankyo) in such a manner that the resin filler 154 is not left on the surfaces of the lower conductor circuits 134 and those of the lands 136a of the through holes 136. Then, buffing is performed to remove flaws caused by the belt sander polishing. These series of polishing are also conducted to the other side of the substrate 130 (FIG. 9(C)). Next, the resin filler 154 is hardened by performing a heating process at 100° C. for one hour and 150° C. for one hour.

Thus, the surface portion of the resin filler 154 filled between the lower conductor circuits 134 and in the through holes 136 and the rough surfaces 134α on the upper surfaces of the lower conductor circuits 134 are removed to thereby flatten the both sides of the substrate. By doing so, it is possible to obtain a wiring substrate in which the resin filler 154 and, the lower conductor circuits 134 and the through holes 136 are fixedly bonded through the rough layers 134α and 136α.

(6) After washing the substrate 130 and degreasing the substrate 130 with an acid, the substrate 130 is subjected to soft etching and an etching solution is sprayed on the both sides of the substrate 130 to etch the surfaces of the lower conductor circuits 134 and the surfaces of the lands 136a of the through holes 136, thereby forming rough surfaces 134β on the entire surfaces of the lands 136a of the through holes 136 and the lower conductor circuits 134 (FIG. 9(D)). As the etching solution, an etching solution containing 10 parts by weight of imidazole copper (II) complex, 7 parts by weight of a glycolic acid and 5 parts by weight of potassium chloride (MEC etch BOND manufactured by Mec Co., Ltd.) Each of the rough layers thus formed preferably has a thickness in a range of 0.1 to 5 μm. In that range, the separation between the conductor circuits and the interlayer resin insulating layers less occurs.

(7) Resin films for forming interlayer resin insulating layers slightly larger than the substrate 130 manufactured in A are mounted on the both sides of the substrate 130, temporarily pressed on conditions of a pressure of 4 kgf/cm², a temperature of 80° C. and a press duration of 10 seconds and cut. Then, the resin films are bonded using a vacuum laminator device by the following method, thereby forming interlayer resin insulating layers 150 on the both sides of the substrate 130 (FIG. 10(A)). Namely, the resin films for forming the interlayer resin insulating layers are actually pressed on the both sides of the substrate on conditions of the degree of vacuum of 0.5 Torr, a pressure of 4 kgf/cm², a temperature of 80° C. and a press duration of 60 seconds and then thermally hardened at 170° C. for 30 minutes.

(8) Next, via hole openings 152 each having a diameter of 80 μm are formed on the interlayer resin insulating layers 150 through masks 151 each having a thickness of 1.2 mm and having penetrating holes 151a formed therein, by using $CO_2$ gas laser at a wavelength of 10.4 μm on conditions of a beam diameter of 4.0 mm, a top-hat mode, a pulse width of 8.0 microseconds, the diameter of each penetrating hole 151a of the masks 151 of 1.0 mm and one shot (FIG. 10(B)).

(9) The substrate 130 having the via hole openings 152 formed therein is immersed in a solution containing 60 g/l of a permanganate acid at a temperature of 80° C. and epoxy resin particles existing on the surfaces of the interlayer resin insulating layers 150 are dissolved and removed, thereby forming rough surfaces 150α on the surfaces of the interlayer resin insulating layers 150 including the inner walls of the via hole openings 152 (FIG. 10(C)). The rough surfaces of the interlayer resin insulating layers are formed to have a thickness in a range of 0.5 to 5 μm. In that range, adhesiveness can be ensured and the conductor layers can be removed in a later step.

(10) Next, the substrate 130, for which the above stated processes have been completed, is immersed in a neutral solution (manufactured by Siplay) and washed. A palladium catalyst is applied to the surfaces of the substrate 130 which surfaces have been roughed (with a rough depth of 3 μm), thereby attaching catalyst cores on the surfaces of the interlayer resin insulating layers 150 and the inner wall surfaces of the via hole openings 152.

(11) Then, the substrate 130 is immersed in an electroless copper plating solution having the following composition to form electroless copper plated films 156 each having a thickness of 0.5 to 5.0 μm on the entire rough surfaces 150α (FIG. 10(D)).

| [Electroless Plating Solution] | |
|---|---|
| $NiSO_4$ | 0.003 mol/l |
| tartaric acid | 0.200 mol/l |
| copper sulfate | 0.030 mol/l |
| HCHO | 0.050 mol/l |
| NaOH | 0.100 mol/l |
| α,α-bipyridyl | 40 mg/l |
| polyethylene glycol (PEG) | 0.10 g/l |

[Electroless Plating Conditions]

40 minutes at a solution temperature of 35° C.

(12) Commercially available photosensitive dry films are bonded onto the electroless copper plated films 156. Masks are mounted on the films, respectively and the films are exposed with 100 mj/cm$^2$ and developed with a 0.8% sodium carbonate solution, thereby providing plating resists 155 each having a thickness of 30 μm. Then, the substrate 130 is washed with water of a temperature of 50° C. and degreased, washed with water of a temperature of 25° C. and with a sulfuric acid, and subjected to copper electroplating on the following conditions, thereby forming electroplated copper films 157 each having a thickness of 20 μm (FIG. 11(A)).

| [Electroplating Solution] | |
|---|---|
| Sulfuric acid | 2.24 mol/l |
| Copper sulfate | 0.26 mol/l |
| Additive | 19.5 mol/l |

(Kaparacid HL manufactured by Atotech Japan)

| [Electroplating Conditions] | |
|---|---|
| Current density | 1 A/dm$^2$ |
| Duration | 65 minutes |
| temperature | 22 ± 2° C. |

(13) After separating and removing the plating resists 155 with 5% NaOH, the electroless plated films 156 under the plating resists 155 are etched with a solution mixture of a sulfuric acid and hydrogen peroxide to remove and dissolve the films 156, thereby forming conductor circuits 145 (including via holes 146) each consisting of the electroless copper plated film 156 and the electroplated copper film 157 and having a thickness of 18 μm (FIG. 11(B)).

(14) The same process as that in (6) is performed, i.e., rough surfaces 145α are formed on the respective conductor circuits 145 by employing an etching solution containing a cupric complex and an organic acid (FIG. 11(C)).

(15) The steps of (7) to (14) are repeated, thereby forming interlayer resin insulating layers 160 and conductor circuits 165 (including via holes 166) further above (FIG. 11(D)).

(16) Next, a solder resist composition prepared in the same manner as that in the first embodiment is obtained.

(17) The solder resist composition is applied to each side of the substrate 130 to have a thickness of 20 μm and dried. Then, a photomask is closely attached to each solder resist layer 170, exposed to ultraviolet rays, developed with a DMTG solution to form openings 171U and 171D each having a diameter of 200 μm. Thereafter, a heating process is performed to harden the solder resist layers 170 to thereby provide the solder resist layers 170 each having openings 171U and 171D and each having a thickness of 20 μm (FIG. 12(A)). The solder resist composition may be a commercially available solder resist composition.

(18) The substrate 130 having the solder resist layers 170 formed thereon is immersed in the same electroless nickel plating solution as that employed in the first embodiment and then immersed in an electroless gold plating solution, thereby forming a nickel plated layer 172 and a gold plated layer 174 in each of the openings 171U and 171D (FIG. 12(B)).

(19) Thereafter, a solder paste containing tin-lead is printed on each opening 171U of the solder resist layers 170 of the substrate 130. Further, a solder paste as a conductive adhesive agent 197 is printed on each opening 171 at the other side of the substrate. Next, conductive connection pins 178 are attached to and supported by an appropriate pin holding device and the fixed portions 198 of the respective conductive connection pins 178 are brought into contact with the conductive adhesive agent 197 within the openings 171D. A reflow process is then performed to fix each conductive connection pin 178 to the conductive adhesive agent 197. Alternatively, to attach the conductive connection pins 178, the conductive adhesive agent 197 may be formed into a ball shape or the like and put in the openings 171D, or the conductive adhesive agent 197 may be joined to the fixed portions 198 to attach the conductive connection pins 178, followed by a reflow process. By doing so, it is possible to obtain a printed circuit board 110 having the solder bumps 176 and the conductive connection pins 178 (FIG. 13).

First Modification of Second Embodiment

A printed circuit board 120 according to the first modification of the second embodiment of the present invention will be described hereinafter with reference to FIG. 19. In the second embodiment stated above, a PGA method for establishing connection through the conductive connection pins 178 as shown in FIG. 13 has been described. The first modification of the second embodiment is almost the same in constitution as the second embodiment except that bumps 176 at a daughter board side are connected to the daughter board by a BGA method.

Now, a method of manufacturing a printed circuit board according to the first modification of the second embodiment will be described with reference to FIGS. 14 to 19.

(1) A copper-clad laminated plate 130A having copper foils 132 each having a thickness of 18 μm and laminated on the both sides of a substrate 130 having a thickness of 1 mm and made of a glass epoxy resin or a BT (Bismaleimide-Triazine) resin is employed as a starting material (FIG. 14(A)). First, this copper-clad laminated plate 130A is drilled and then a plating resist is formed. Thereafter, the substrate 130 is subjected to an electroless copper plating process to form through holes 136 and the copper foils 132 are etched in a pattern fashion according to an ordinary method, thereby forming lower conductor circuits 134 on both sides of the substrate 130 (FIG. 14(B)).

(2) After washing and drying the substrate 130 on which the lower conductor circuits 134 have been formed, an etching solution is sprayed on the both sides of the substrate 130 and the surfaces of the lower conductor circuits 134, the inner walls of the through holes 136 and the surfaces of lands 136a are etched, thereby forming rough layers 134α and 136α on the entire surfaces of the lower conductor circuits 134 including the through holes 136 (FIG. 14(C)). As the etching solution, a solution mixture of 10 parts by weight of imidazole copper (II) complex, 7 parts by weight of a glycolic acid, 5 parts by weight of potassium chloride and 78 parts by weight of ion-exchange water is employed. The roughing process may be performed by conducting soft etching, by conducting a blackening (oxidization)-reduction process or by forming a needle alloy plated material (Interplate manufactured by EBARA UDYLITE Co., Ltd.) consisting of copper-nickel-phosphorous or the like.

(3) Next, the surfaces of the lands 136a of the through holes 136 having the rough layers 136α formed thereon, respectively, are polished by buffing to flatten the surfaces of the lands 136a (FIG. 14(D)).

(4) Next, a mask 139 having opening portions 139a corresponding to the respective through holes 136 is mounted on the substrate 130 and resin filler 154 mainly consisting of an epoxy resin is applied using a printer (FIG. 15(A)). In the step of (3), after forming the rough layers 136α on the through holes 136, the surfaces of the lands 136a of the through holes 136 are polished and flattened. Due to this, when filling the resin filler in the through holes 136, it is possible to prevent the resin filler 154 from flowing out along the rough layers (anchors) formed on the lands 136a of the thorough holes 136. It is, therefore, possible to form the filler 154 in the through holes flat and to enhance the reliability of wirings above the through holes to be formed in a step described later.

Thereafter, using the printer, the resin filler 154 mainly consisting of an epoxy resin is applied onto the both sides of the substrate 130 and dried. Namely, through this step, the resin filler 154 is filled between the lower conductor circuits 134 (FIG. 15(B)). As the resin filler 154, it is preferable to employ one selected from a mixture of an epoxy resin and organic filler, a mixture of an epoxy resin and inorganic filler and a mixture of an epoxy resin and inorganic fiber. Alternatively, the resin filler in the first embodiment may be employed.

(5) One side of the substrate 130 for which the process described in (4) above has been completed, is polished by belt sander polishing using belt abrasive paper (manufactured by Sankyo) in such a manner that the resin filler 154 is not left on the surfaces of the lower conductor circuits 134 and those of the lands 136a of the through holes 136. Then, buffing is performed to remove flaws caused by the belt sander polishing. These series of polishing are also conducted to the other side of the substrate 130. The resin filler 154 thus filled is thermally hardened (FIG. 15(C)).

(6) Next, the same etching solution as that employed in (2) above is sprayed on the both sides of the substrate 130 for which the process described in (5) above has been completed and the surfaces of the lower conductor circuits 134 and those of the lands 136a of the through holes 136 which have been flattened once are etched, thereby forming rough surfaces 134α on the entire surfaces of the lower conductor circuits 134 (FIG. 15(D)).

(7) Then, thermosetting cycloolefin resin sheets each having a thickness of 50 μm are laminated by vacuum pressing while raising a temperature to 50 to 150° C. and at a pressure of 5 kg/cm² to thereby provide interlayer resin insulating layers 150 each consisting of a cycloolefin resin (FIG. 16(A)). The degree of vacuum during vacuum pressing is 10 mmHg. Alternatively, the resin films employed in the second embodiment may be employed instead of the above resin sheets.

(8) Next, via hole openings 152 each having a diameter of 80 μm are formed on the interlayer resin insulating layers 150 through masks 151 each having a thickness of 1.2 mm and having penetrating holes 151a formed therein, by using $CO_2$ gas laser at a wavelength of 10.4 μm on conditions of a beam diameter of 5 mm, a top-hat mode, a pulse width of 50 microseconds, the diameter of each hole of the masks of 0.5 mm and three shots (FIG. 16(B)). Then, a de-smear process is performed using oxygen plasma.

(9) Then, using SV-4540 manufactured by ULVAC JAPAN, Ltd., a plasma process is performed to rough the surfaces of the interlayer resin insulating layers 150, thereby forming rough surfaces 150α (FIG. 16(C)). The plasma process is performed for two minutes while using, as inert gas, argon gas on conditions of power of 200 W, a gas pressure of 0.6 Pa and a temperature of 70° C. Alternatively, the rough surfaces may be formed by using an acid or an oxidizer.

(10) Next, using the same device, the argon gas contained inside is exchanged and sputtering is conducted with Ni and Cu as targets, on conditions of an atmospheric pressure of 0.6 Pa, a temperature of 80° C., power of 200 W and a duration of 5 minutes, thereby forming Ni/Cu metal layers 148 on the surfaces of the respective interlayer resin insulating layers 150. At this time, the thickness of each Ni/Cu metal layer 148 is 0.2 μm (FIG. 16(D)). Electroless copper plated films may be further formed on the layers 148, respectively, instead of conducting sputtering.

(11) Next, commercially available photosensitive dry films are bonded onto the both sides of the substrate 130 for which the above process has been completed. Photomask films are mounted, exposed with 100 mJ/cm² and developed with a 0.8% sodium carbonate solution, thereby forming plating resists 155 each having a thickness of 15 μm. Then, the substrate 130 is subjected to electroplating on the following conditions, thereby forming electroplated films 157 each having a thickness of 15 μm (FIG. 17(A)). It is noted that an additive in the electroplating solution is Kaparacid HL manufactured by Atotech Japan.

| [Electroplating Solution] | |
| --- | --- |
| Sulfuric acid | 2.24 mol/l |
| Copper sulfate | 0.26 mol/l |
| Additive | 19.5 mol/l |

| [Electroplating Conditions] | |
| --- | --- |
| Current density | 1 A/dm² |
| Duration | 65 minutes |
| temperature | 22 ± 2° C. |

(12) After separating and removing the plating resists 155 with 5% NaOH, the Ni/Cu metal layers 148 existing below the plating resists 155 are dissolved and removed by performing etching with a solution mixture of a nitric acid, a sulfuric acid and hydrogen peroxide, thereby forming conductor circuits 145 (including via holes 146) each consisting of the electroplated copper film 157 and the like and having a thickness of 16 μm (FIG. 17(B)).

(13) Next, the same etching process as that in the step of (6) is performed to form rough surfaces 145α on the conductor circuits 145, respectively (FIG. 17(C)).

(14) By repeating the steps of (7) to (13) above, interlayer resin insulating layers 160 and conductor circuits 165 (including via holes 166) are formed further above (FIG. 17(D)).

(15) Next, a solder resist composition (organic resin insulating material) prepared in the same manner as that in the first embodiment is obtained.

(16) The solder resist composition is applied to each side of the substrate 130 to have a thickness of 20 μm and dried. Then, a photomask is closely attached to each solder resist layer 170, exposed to ultraviolet rays, developed with a DMTG solution to thereby form openings 171 each having a diameter of 200 µm. Thereafter, a heating process is performed to harden the solder resist layers 170 to thereby provide the solder resist layers 170 each having openings 171 and having a thickness of 20 µm (FIG. 18(A)).

(17) The substrate 130 having the solder resist layers 170 formed thereon is immersed in an electroless nickel plating solution to form nickel plated layers 172 each having a thickness of 5 µm in the respective openings 171. Further, the substrate 130 is immersed in an electroless plating solution to thereby form gold plated layers 174 each having a thickness of 0.03 µm on the respective nickel plated layers 172 (FIG. 18(B)).

Figure 19:
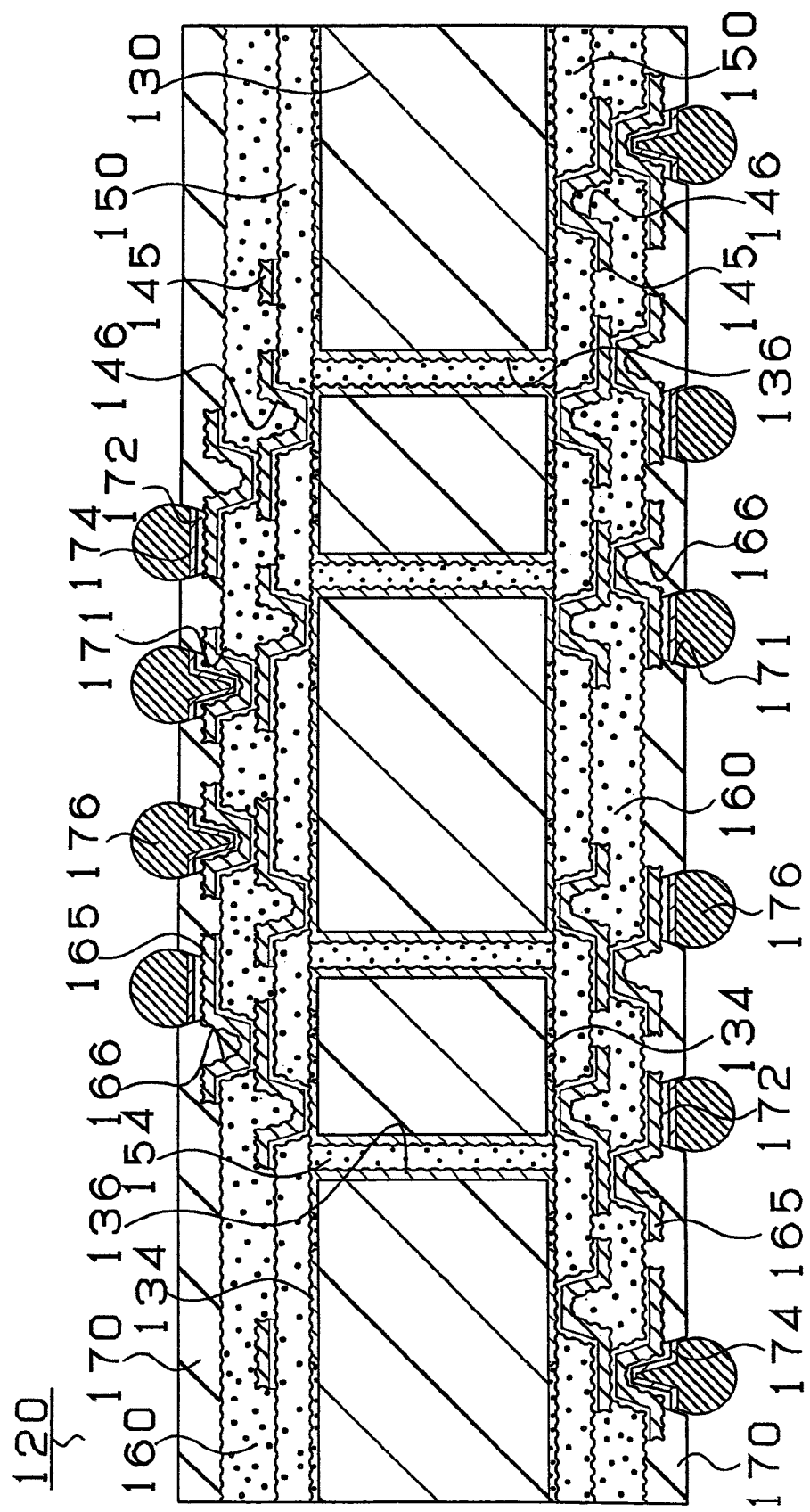
FIG. 19 is a cross-sectional view of the multi-layer printed circuit board according to the first modification of the second embodiment.

(18) Then, a solder paste is printed on each opening 171 of the solder resist layers 170 and a reflow process is performed at 200° C. to form solder bumps 176, thus manufacturing a printed circuit board 120 having the solder bumps 176 (FIG. 19).

Second Modification of Second Embodiment

Figure 20:
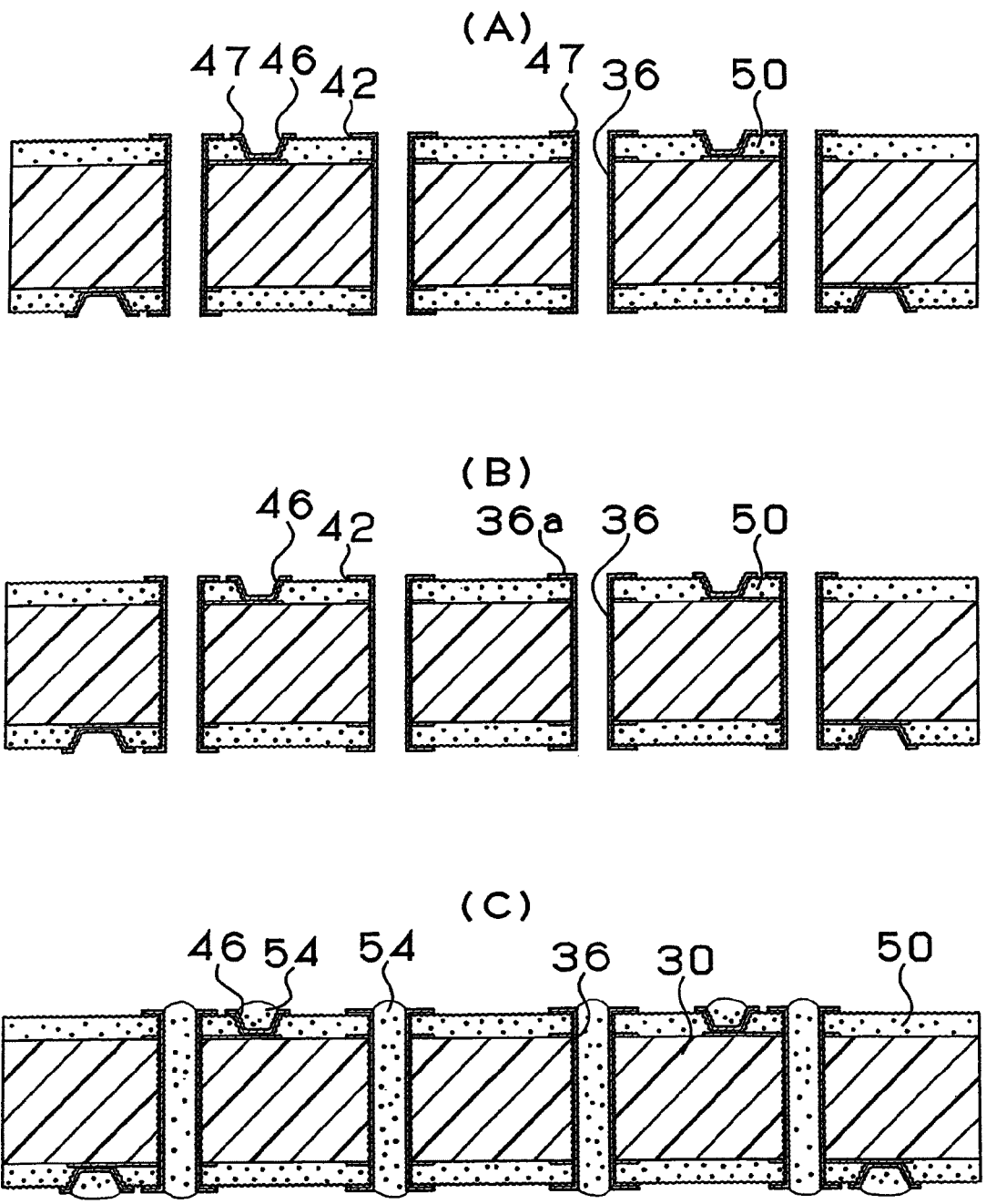
FIG. 20 is a cross-sectional view of the multi-layer printed circuit board according to the second modification of the second embodiment.
Figure 22:
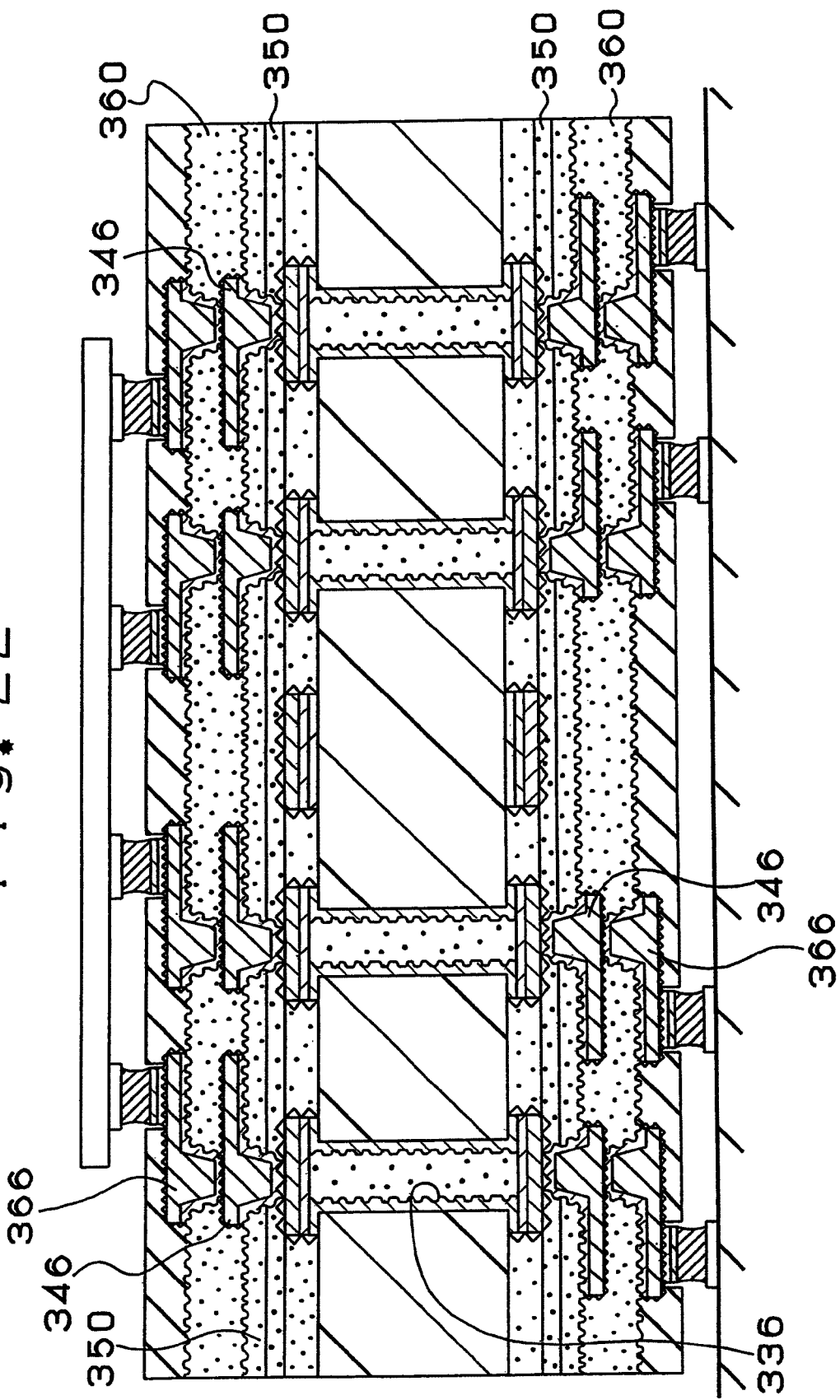
FIG. 22 is a cross-sectional view of a conventional multi-layer printed circuit board.

A printed circuit board according to the second modification is almost the same as the printed circuit board in the first embodiment described above with reference to FIGS. 1 to 6. However, in the second modification, as shown in FIG. 20(A), after rough layers (made of an alloy consisting of Cu—Ni—P) 47 are formed on via holes 46 and through holes 36, respectively, by electroless plating, the lands 136a of the through holes 36 on which the rough layers 47 have been formed, respectively, are polished by buffing and flattened (FIG. 20(B)). Thereafter, resin filler 54 is filled in the through holes 36 and the via holes 46 through masks and dried (FIG. 20(C)). By doing so, it is possible to prevent the resin filler 54 from flowing out along the rough layers 47.

COMPARISON EXAMPLE 5

A printed circuit board in a comparison example 5 is basically the same as the printed circuit board in the second embodiment except that the land surfaces of through holes having rough layers formed thereon, respectively, are not polished nor flattened but resin filler is filled in the through holes. The remaining conditions are the same as those in the second embodiment.

COMPARISON EXAMPLE 6

A printed circuit board in a comparison example 6 is basically the same as the printed circuit board in the first modification of the second embodiment except that the land surfaces of through holes having rough layers formed thereon, respectively, are not polished nor flattened but resin filler is filled in the through holes. The remaining conditions are the same as those in the first modification of the second embodiment.

COMPARISON EXAMPLE 7

A printed circuit board in a comparison example 7 is basically the same as the printed circuit board in the second modification of the second embodiment except that the land surfaces of through holes having rough layers formed thereon, respectively, are not polished nor flattened but resin filler is filled in the through holes. The remaining conditions are the same as those in the second modification of the second embodiment.

The printed circuit boards in the second embodiment, the first modification and the second modification of the second embodiment were compared with the printed circuit boards in the comparison examples in respect of three points, i.e., the roughing method, the surface polishing of the lands of the through holes and the flow of the resin filler out of the through holes. The comparison result is shown in FIG. 21. As is obvious from the result shown in FIG. 21, in the printed circuit boards in the comparison examples 5, 6 and 7, the resin filler flowed out along the rough layers formed on the lands of the through holes when filling the resin filler in the through holes because the surfaces of the lands of the through holes having the rough layers formed thereon, respectively, were not polished.

What is claimed is:

1. A multi-layer printed circuit board comprising:
a core substrate having a plurality of penetrating holes and having a first surface and a second surface;
a plurality of buildup layers over the first and second surfaces of the core substrate, respectively, each of the buildup layers comprising a plurality of interlayer resin insulating layers and a plurality of conductor layers alternately provided, the plurality of interlayer resin insulating layers including a lower interlayer resin insulating layer formed adjacent to the core substrate and an upper interlayer resin insulating layer formed over the lower interlayer resin insulating layer;
a plurality of through holes formed in the plurality of penetrating holes of the core substrate, respectively, and through the lower interlayer resin insulating layers and filled with a resin filler including inorganic particles;
a plurality of first via holes filled with a resin filler including inorganic particles and formed in the lower interlayer resin insulating layers; and
a plurality of second via holes formed in the upper interlayer resin insulating layers,
wherein the inorganic particles are coated with a silica coupling agent, and the second via holes are formed right on the through holes, respectively.

2. A multi-layer printed circuit board according to claim 1, wherein the resin filler in the through holes and the resin filler in the first via holes are a same resin filler.

3. A multi-layer printed circuit board according to claim 1, wherein the inorganic particles in at least one of the resin filler in the through holes and the resin filler in the first via holes comprise at least one compound selected from the group consisting of aluminum compounds, calcium compounds, potassium compounds, magnesium compounds and silicon compounds.

4. A multi-layer printed circuit board according to claim 1, wherein the inorganic particles in at least one of the resin filler in the through holes and the resin filler in the first via holes comprise at least one compound selected from the group consisting of alumina, aluminum hydroxide, calcium carbonate, calcium hydroxide, magnesia, dolomite, basic magnesium carbonate, talc, silica and zeolite.

5. A multi-layer printed circuit board according to claim 1, wherein at least one of the resin filler in the through holes and the resin filler in the first via holes comprises the inorganic particles in 10 to 50 wt %.

6. A multi-layer printed circuit board according to claim 1, wherein at least one of the resin filler in the through holes and the resin filler in the first via holes comprises the inorganic particles in 20 to 40 wt %.

7. A multi-layer printed circuit board according to claim 1, wherein the inorganic particles in at least one of the resin filler in the through holes and the resin filler in the first via holes have at least one of a spherical shape, a circular shape, an ellipsoidal shape, a pulverized shape and a polygonal shape.

8. A multi-layer printed circuit board according to claim 1, wherein the inorganic particles in at least one of the resin filler in the through holes and the resin filler in the first via holes have at least one of a spherical shape, a circular shape and an ellipsoidal shape.

9. A multi-layer printed circuit board according to claim 1, wherein the core substrate comprises a resin.

10. A multi-layer printed circuit board according to claim 1, wherein the core substrate comprises a resin selected from the group consisting of an FR4 resin, an FR5 resin and a BT resin.

11. A multi-layer printed circuit board according to claim 1, wherein the plurality of through holes has a plurality of plated covers covering end opening portions of the through holes, respectively, and the second via holes are formed on the plated covers.

12. A multi-layer printed circuit board according to claim 1, wherein the lower interlayer resin insulating layer has a roughened surface on which the conductor layers are formed.

* * * * *